United States Patent
Ono

(10) Patent No.: US 8,878,186 B2
(45) Date of Patent: Nov. 4, 2014

(54) SEMICONDUCTOR DEVICE AND DISPLAY APPARATUS

(75) Inventor: Shinya Ono, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/122,048

(22) PCT Filed: Nov. 30, 2011

(86) PCT No.: PCT/JP2011/006726
§ 371 (c)(1),
(2), (4) Date: Nov. 25, 2013

(87) PCT Pub. No.: WO2013/080260
PCT Pub. Date: Jun. 6, 2013

(65) Prior Publication Data
US 2014/0097455 A1 Apr. 10, 2014

(51) Int. Cl.
*H01L 27/14* (2006.01)
*H01L 27/12* (2006.01)

(52) U.S. Cl.
CPC .......... *H01L 27/124* (2013.01); *H01L 27/1255* (2013.01); *H01L 27/1248* (2013.01)
USPC ........................................................ 257/72

(58) Field of Classification Search
CPC .............. H01L 2021/775; H01L 2924/13069; H01L 27/1214; H01L 27/1251; H01L 27/3248; H01L 27/3241; H01L 27/3244; H01L 27/3267; H01L 27/3281; H01L 27/124; H01L 27/1248; H01L 27/1255; H01L 51/0508
See application file for complete search history.

(56) References Cited

U.S. PATENT DOCUMENTS

| | | | |
|---|---|---|---|
| 6,392,255 | B1 | 5/2002 | Shibata et al. |
| 6,624,012 | B2 | 9/2003 | Shibata et al. |
| 6,998,299 | B2 | 2/2006 | Shibata et al. |
| 7,282,737 | B2 | 10/2007 | Shibata et al. |
| 7,541,618 | B2 | 6/2009 | Shibata et al. |
| 8,253,131 | B2 | 8/2012 | Takeuchi |
| 2002/0132399 | A1 | 9/2002 | Shibata et al. |
| 2004/0016924 | A1 | 1/2004 | Yamada et al. |
| 2004/0058483 | A1 | 3/2004 | Shibata et al. |

(Continued)

FOREIGN PATENT DOCUMENTS

| | | |
|---|---|---|
| JP | 06-167722 | 6/1994 |
| JP | 2001-015758 | 1/2001 |
| JP | 2001-094112 | 4/2001 |
| JP | 2003-338509 | 11/2003 |

OTHER PUBLICATIONS

U.S. Appl. No. 14/147,635 to Kouhei Koresawa et al., filed Jan. 6, 2014.

(Continued)

*Primary Examiner* — Brook Kebede
(74) *Attorney, Agent, or Firm* — Greenblum & Bernstein, P.L.C.

(57) ABSTRACT

A semiconductor device according to an aspect of the present invention includes: a semiconductor layer including a channel region and a contact region; a pattern of a first conducting layer disposed at a position which overlaps with the channel region; a gate line formed in one of a second conducting layer or a third conducting layer, and connected to the pattern of the first conducting layer; and a source line formed in the other of the second conducting layer and the third conducting layer, and connected to the contact region.

23 Claims, 22 Drawing Sheets

(56) References Cited

U.S. PATENT DOCUMENTS

| | | |
|---|---|---|
| 2005/0051776 A1* | 3/2005 | Miyagi et al. .................. 257/72 |
| 2006/0194375 A1 | 8/2006 | Shibata et al. |
| 2008/0036935 A1 | 2/2008 | Shibata et al. |
| 2010/0308326 A1* | 12/2010 | Kim et al. ....................... 257/43 |
| 2012/0119235 A1 | 5/2012 | Nishiyama et al. |
| 2012/0268002 A1 | 10/2012 | Osako et al. |

OTHER PUBLICATIONS

International Search Report (ISR) in International Patent Application No. PCT/JP2011/006726, dated Feb. 21, 2012.

* cited by examiner

SEMICONDUCTOR DEVICE AND DISPLAY APPARATUS

TECHNICAL FIELD

The present invention relates to semiconductor devices and particularly relates to a semiconductor device obtained by forming a thin-film transistor having polycrystalline silicon as an active layer.

BACKGROUND ART

In recent years, there has been a further demand for increased performance, such as larger size, higher definition, and faster display frequency, has been placed on flat-panel displays represented by liquid-crystal displays and organic electroluminescence (EL) displays which make use of electroluminescence of organic materials.

In particular, development of thin-film transistors (TFTs), which have excellent characteristics as drive circuits of active-matrix display apparatuses, is being rushed. Amidst the demand for the high current driving performance of thin-film transistors, thin-film transistors using crystallized semiconductor thin-films for the active layer have been put into practical use, and, in particular, top gate-structure, low-temperature polysilicon TFTs which have a semiconductor layer crystallized by irradiation with a laser beam such as an excimer laser is widely used as a device which not only has high current performance but also realizes high ON/OFF current ratio and extremely low parasitic capacitance through a self-alignment process and an LDR structure.

CITATION LIST

Patent Literature

[PTL 1] Japanese Unexamined Patent Application Publication No. 2003-338509

SUMMARY OF INVENTION

Technical Problem

The following is disclosed as a method of fabricating a top gate TFT (for example, Patent Literature (PTL) 1).

In PTL 1, first, a non-crystalline silicon thin film of approximately 40 to 50 nm thickness is formed above a substrate, and dehydrogenation annealing is performed. Then, the silicon thin film is crystallized in an annealing process through irradiation with the laser beam of an excimer laser, or the like, after which it is formed into the active layer of a TFT by being patterned into a predetermined shape.

Next, an insulating film such as a $SiO_2$ film is deposited above the active layer to form a gate insulating film, and a gate electrode layer (hereafter referred to as a gate layer) comprising a metal such as Cr, W, Mo, or the like, or a composite material thereof is formed above the active layer with the gate insulating film disposed therebetween. Then, the gate layer is formed into a predetermined shape by selectively leaving a photoresist on the gate layer, to thereby form a gate electrode.

Next, using a resist on the gate electrode as a mask, high-concentration doping ions are implanted through the gate insulating film and into the active layer, and a source region and a drain region are formed. Since the region below the gate electrode is masked by the resist on the gate electrode, a channel region not implanted with doping ions is formed.

In addition, after removing the resist on the gate electrode, low-concentration doping ions are implanted into the active layer exposed through the gate insulating film, with the gate electrode serving as a mask. With this, a region (LDR) implanted with low-concentration doping ions is formed between the channel region formed in the active layer directly below the gate electrode and the source region and drain region which are formed through the implantation of high-concentration doping ions.

After the implantation of high-concentration doping ions and low-concentration doping ions is completed, the injected doping ions are activated by heating the active layer using once again an excimer laser or substrate heat treatment.

Subsequently, after depositing $SiN_x$ and $SiO_2$ films and forming an interlayer insulating film, the hydrogen in the $SiN_x$ layer is supplied to the active layer through heat treatment and the defect level of the active layer that was crystallized by laser annealing is hydrogen-terminated in order to stabilize the TFT characteristics.

Then, a contact hole is opened in the gate insulating film and the interlayer insulating film above the source region and the drain region, and source/drain layers (hereafter referred to SD layers) comprising a metal material such as Al, or the like, are formed above the opening by patterning, and, by being connected to the source region and the drain region, become the source electrode and the drain electrode, respectively.

In this manner, the material of the gate layer needs to be highly heat-resistant so as not to change shape or change properties during the substrate heat treatment after the gate electrode forming. However, for metals used as a typical electrode material, there is a tendency that those with higher heat resistance have reduced conductivity. Therefore, when a metal with high heat resistance is used as the material of the gate electrode and a gate line is formed in the same layer using the same metal material as the gate electrode, the wiring resistance of the gate line becomes high. A high wiring resistance causes signal delay due to increased wire time constant, and display unevenness due to voltage drop. In other words, when the panel area becomes large and the drive frequency increases, the impact of wiring resistance increases.

Furthermore, when the voltage holding capacitance in a pixel is formed at the gate layer, the interlayer insulating film, and the SD layer, a larger capacitance value is preferable in order to prevent crosstalk and stabilize the brightness in 1 frame. In other words, it is necessary to either increase the dielectric constant of the interlayer insulating film above the gate layer or increase the per-unit area capacitance value by reducing film thickness.

On the other hand, when the gate line is formed in the gate layer and a source line is formed at the SD layer for example, the wiring parasitic capacitance formed at the crossing part of the gate line and the source line is also formed at the gate layer, the interlayer insulating film, and the SD layer in the same manner as the voltage holding capacitance in a pixel. From the viewpoint of reducing the wire time constant, a smaller capacitance value is preferable.

In other words, when the per-unit area capacitance value of the interlayer insulating film above the gate layer is increased in order to keep the holding capacitance in the pixel large, it is necessary to reduce the resistance of a control line in order for the wire time constant for driving the panel to be set less than or equal to a specified value. However, as described in the above TFT fabrication process, the gate electrode in particular is required to have high heat resistance, and thus the control line formed in the gate layer becomes a wire with a high resistance and the wire time constant increases the more the holding capacitance in the pixel is kept large.

The present invention solves the above-described problem and has as an object to provide a semiconductor device in which each of the gate electrode and the gate line is formed with a material having properties suitable thereto, and the parasitic capacitance between the gate line and the source line is reduced.

Solution to Problem

A semiconductor device according to an aspect of the present invention includes: a substrate; a semiconductor layer formed above the substrate; a first insulating layer formed above the semiconductor layer; a first conducting layer formed above the first insulating layer; a second insulating layer formed above the first conducting layer; a second conducting layer formed above the second insulating layer; a third insulating layer formed above the second conducting layer; a third conducting layer formed above the third insulating layer; a gate line; and a source line provided crossing the gate line. The semiconductor layer includes at least a channel region and a contact region. The first insulating layer has a first contact hole formed at a position which overlaps with the contact region, the first contact hole connecting a pattern for the second conducting layer or a pattern for the third conducting layer and the contact region of the semiconductor layer. A pattern for the first conducting layer is disposed at a position which overlaps with at least the channel region. The second insulating layer has: a second contact hole formed connected to the first contact hole, the second contact hole connecting the pattern for the second conducting layer and the contact region of the semiconductor layer or the pattern for the third conducting layer and the contact region of the semiconductor layer; and a third contact hole formed at a position which overlaps with the pattern for the first conducting layer, the third contact hole connecting the pattern for the second conducting layer and the pattern for the first conducting layer or the pattern for the third conducting layer and the pattern for the first conducting layer. The third insulating layer has a fourth contact hole. The gate line is formed in one of the second conducting layer and the third conducting layer, and connected to the pattern for the first conducting layer through at least the third contact hole. The source line is formed in the other of the second conducting layer and the third conducting layer, and connected to the contact region through any of the first to fourth contact holes.

Advantageous Effects of Invention

According to the present invention, it is possible to obtain a semiconductor device in which each of the gate electrode and the gate line is formed with a material having properties suitable thereto, and the parasitic capacitance between the gate line and the source line is reduced.

DESCRIPTION OF EMBODIMENTS

Figure 1:
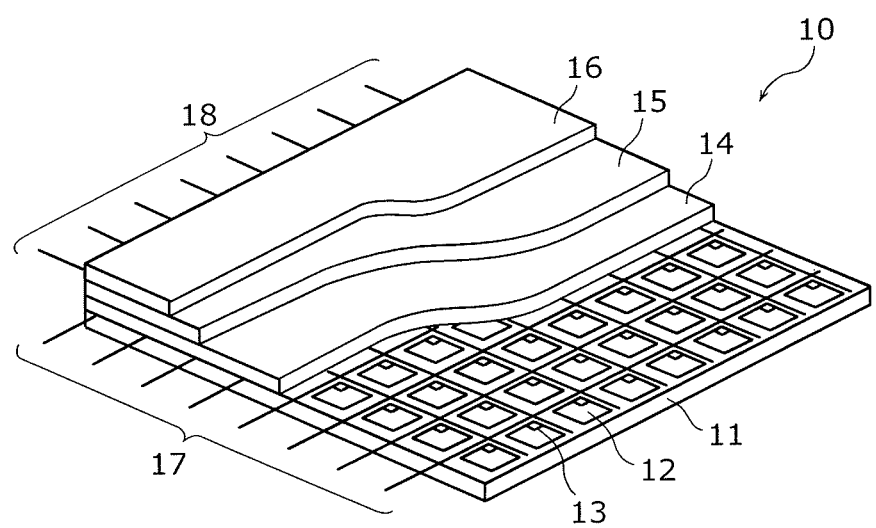
FIG. 1 is a partial cut-out perspective view of an organic EL display apparatus according to Embodiment 1.

A semiconductor device according to an aspect of the present invention includes: a substrate; a semiconductor layer formed above the substrate; a first insulating layer formed above the semiconductor layer; a first conducting layer formed above the first insulating layer; a second insulating layer formed above the first conducting layer; a second conducting layer formed above the second insulating layer; a third insulating layer formed above the second conducting layer; a third conducting layer formed above the third insulating layer; a gate line; and a source line provided crossing the gate line. The semiconductor layer includes at least a channel region and a contact region. The first insulating layer has a first contact hole formed at a position which overlaps with the contact region, the first contact hole connecting a pattern for the second conducting layer or a pattern for the third conducting layer and the contact region of the semiconductor layer. A pattern for the first conducting layer is disposed at a position which overlaps with at least the channel region. The second insulating layer has: a second contact hole formed connected to the first contact hole, the second contact hole connecting the pattern for the second conducting layer and the contact region of the semiconductor layer or the pattern for the third conducting layer and the contact region of the semiconductor layer; and a third contact hole formed at a position which overlaps with the pattern for the first conducting layer, the third contact hole connecting the pattern for the second conducting layer and the pattern for the first conducting layer or the pattern for the third conducting layer and the pattern for the first conducting layer. The third insulating layer has a fourth contact hole. The gate line is formed in one of the second conducting layer and the third conducting layer, and connected to the pattern for the first conducting layer through at least the third contact hole. The source line is formed in the other of the second conducting layer and the third conducting layer, and connected to the contact region through any of the first to fourth contact holes.

According to the above-described configuration, the pattern for the first conducting layer and the gate line formed in the second conducting layer or third conducting layer can be formed with a material that is suitable for each one. For example, it is sufficient that the pattern for the first conducting layer, which is exposed to high temperature during the crystallization of the channel region, be formed using a metal having high heat resistance. Furthermore, it is sufficient that the gate line be formed using a metal with a low resistance.

Furthermore, by forming the gate line in one of the second conducting layer and the third conducting layer, and forming the source line in the other of the second conducting layer and the third conducting layer, the gate line and the source line cross each other via the third insulating layer. Since the thickness of the third insulating layer can be set relatively freely, the parasitic capacitance generated at the crossing part of the gate line and the source line can be reduced.

It should be noted that in the embodiments, "pattern" refers to the result obtained by patterning the metal film making up a conducting layer. For example, typical examples of a pattern include, but are not limited to, an electrode, a line, and so on. Furthermore, "overlap" in the present Description refers to a positional relationship of lying on top of each other in the vertical direction.

The semiconductor device may further include a capacitor unit including: a first capacitor electrode formed in the first conducting layer; a dielectric formed at a position in the second insulating layer which overlaps with the first capacitor electrode; and a second capacitor electrode formed at a position in the second conducting layer which overlaps with the dielectric.

As in the above-described configuration, by forming the electrodes included in the capacitor unit in the first conducting layer and the second conducting layer, a metal-insulator-metal (MIM) capacitor unit can be formed.

Furthermore, the second insulating layer may have a per-unit area electrostatic capacitance larger than a per-unit area electrostatic capacitance of the third insulating layer.

With this, a large-capacity capacitor unit can be formed in a small area.

Furthermore, a region at which the gate line and the source line cross may be insulated by the third insulating layer.

Furthermore, the third contact hole may be formed at the position which overlaps with the channel region.

Furthermore, the gate line may be connected, through at least the third contact hole, to the pattern for the first conducting layer disposed at the position which overlaps with the channel region.

As an example, the gate line may be formed in the third conducting layer, and the source line may be formed in the second conducting layer.

Furthermore, the fourth contact hole may be formed connected to the third contact hole. In addition, a pattern for the third conducting layer may be directly connected, through the third and fourth contact holes, to the pattern for the first conducting layer disposed at the position which overlaps with the channel region.

Furthermore, the fourth contact hole may be formed at a position which overlaps with the pattern for the second conducting layer. In addition, a pattern for the third conducting layer may be connected, via the pattern for the second conducting layer, to the pattern for the first conducting layer disposed at the position which overlaps with the channel region.

As another example, the gate line may be formed in the second conducting layer, and the source line may be formed in the third conducting layer.

Furthermore, the third conducting layer may have a sheet resistance smaller than a sheet resistance of the second conducting layer.

Furthermore, the third conducting layer may have a thickness greater than a thickness of the second conducting layer.

Furthermore, the gate line may be formed in the third conducting layer.

The semiconductor device may further include: a fourth insulating layer formed above the third conducting layer; and a fourth conducting layer formed above the fourth insulating layer. In addition, the fourth insulating layer may have a fifth contact hole formed at a position which overlaps with at least the pattern for the third conducting layer.

Furthermore, the fifth contact hole may be formed connected to the fourth contact hole. In addition, the fourth contact hole may be formed connected to the second contact hole. Moreover, a pattern for the fourth conducting layer may be directly connected to the contact region of the semiconductor layer through the first, second, fourth, and fifth contact holes.

Furthermore, the fifth contact hole may be formed at the position which overlaps with the pattern for the third conducting layer. In addition, a pattern for the fourth conducting layer may be directly connected to the pattern for the third conducting layer through the fifth contact hole.

Furthermore, the fourth contact hole may be formed connected to the second contact hole. In addition, the pattern for the fourth conducting layer may be connected to the contact region of the semiconductor layer via the pattern for the third conducting layer.

Furthermore, the fourth contact hole may be formed at a position which overlaps with the pattern for the second conducting layer. In addition, the pattern for the fourth conducting layer may be connected to the pattern for the second conducting layer via the pattern for the third conducting layer.

Furthermore, the second contact hole may be formed connected to the first contact hole. In addition, the pattern for the second conducting layer may be formed at a position which overlaps with the second contact hole. In addition, the pattern for the fourth conducting layer may be connected to the contact region of the semiconductor layer, via the pattern for the second conducting layer and the pattern for the third conducting layer.

Furthermore, the fifth contact hole may be formed connected to the fourth contact hole. Furthermore, the fourth contact hole may be formed at a position which overlaps with the pattern for the second conducting layer. In addition, a pattern for the fourth conducting layer may be directly connected to the pattern for the second conducting layer, through the fourth and fifth contact holes.

Furthermore, the third contact hole may be formed at a position which overlaps with the pattern for the second conducting layer. In addition, the pattern for the fourth conducting layer may be connected to the pattern for the first conducting layer via the pattern for the second conducting layer.

Furthermore, the second contact hole may be formed connected to the first contact hole. In addition, the pattern for the second conducting layer may be formed at a position which overlaps with the second contact hole. In addition, the pattern for the fourth conducting layer may be connected to the contact region of the semiconductor layer, via the pattern for the second conducting layer.

Furthermore, the first conducting layer or the semiconductor layer may include a height-adjustment layer formed at a position which overlaps with the fourth contact hole.

Furthermore, the first conducting layer or the semiconductor layer may include a height-adjustment layer formed at a position which overlaps with the fifth contact hole.

In addition, the second conducting layer may include a height-adjustment layer formed at a position which overlaps with the fifth contact hole.

As in the above-described configuration, by providing a height-adjustment layer at a position which overlaps with a contact hole, the insulating layer stacked above the height-adjustment layer is selectively pushed up. As a result, the depth of the contact hole is reduced, and thus the opening area of the contact hole can be reduced. With this, according to the above-described configuration, the area of the light-emitting layer can be increased.

Furthermore, the gate line and a line to be disposed parallel to the gate line may be formed in the third conducting layer. In addition, a line to be disposed parallel to the source line may be formed in one of the first conducting layer and the second conducting layer.

Furthermore, the gate line may be formed in the second conducting layer. In addition, a line to be disposed parallel to the gate line may be formed in one of the first conducting layer and the second conducting layer. In addition, a line to be disposed parallel to the source line may be formed in the third conducting layer.

A display apparatus according to an aspect of the present invention includes pixels arranged in a matrix. Specifically, the display apparatus includes: gate lines disposed parallel to each other; source lines disposed parallel to each other and crossing the gate lines; and a plurality of the semiconductor devices described above, which drive the pixels each of which is formed at a different one of crosspoints between the gate lines and the source lines.

The semiconductor device may further include: a fourth insulating layer formed above the third conducting layer; and a fourth conducting layer formed above the fourth insulating layer. In addition, a pattern for the fourth conducting layer is disposed independently for each of the pixels.

The semiconductor device may further include: a fourth insulating layer formed above the third conducting layer; and a fourth conducting layer formed above the fourth insulating layer. In addition, a pattern for the fourth conducting layer is disposed across a plurality of the pixels.

Hereinafter, a semiconductor device and a method of fabricating the same according to the present invention shall be described with reference to the drawings. It should be noted that the present invention is defined based on the recitations in the Claims. Therefore, among the structural elements in the following embodiments, structural elements not recited in the claims are not necessarily required to achieve the object of the present invention. In other words, the following embodiments describe preferred modes of the present invention. Furthermore, the respective figures are schematic diagrams and are not necessarily precise illustrations.

Embodiment 1

First, an example in which a semiconductor device according to Embodiment 1 of the present invention is applied to an organic EL display apparatus shall be described with reference to FIG. 1. FIG. 1 is a partial cut-out perspective view of an organic EL display apparatus according to Embodiment 1.

As shown in FIG. 1, an organic EL display apparatus 10 includes: an active-matrix substrate (TFT array substrate) 11; pixels 12 arranged in a matrix in the active-matrix substrate 11; pixel circuits 13 arranged in an array above the active-matrix substrate 11, and each connected to a corresponding one of the pixels 12; a pixel electrode 14 sequentially stacked above the pixels 12 and the pixel circuits 13; an organic EL layer 15; a common electrode 16; and source lines 17 and gate lines 18 which connect the respective pixel circuits 13 and a control circuit (not shown in the figure). The organic EL layer 15 is formed through the stacking of individual layers such as an electron transport layer, a light-emitting layer, a hole transport layer, and so on. It should be noted that although Embodiment 1 describes an example in which the pixel electrode (anode) 14 is formed separately for each pixel, and the common electrode (cathode) 16 is formed in common for all the pixels, the present invention is not limited to such configuration, and the anode may be formed in common for all the pixels and the cathode may be formed separately for each of the pixels.

Furthermore, each of the source lines 17 is arranged corresponding to a different one of the columns of the pixels 12 which are arranged in a matrix. In other words, the source lines 17 are arranged parallel to each other. On the other hand, each of the gate lines 18 is arranged corresponding to a different one of the rows of the pixels which are arranged in a matrix. In other words, the gate lines 18 are arranged parallel to each other. As a result, the source lines 17 and the gate lines 18 are arranged to cross each other. In addition, a pixel circuit 13 is disposed at each crosspoint of the source lines 17 and gate lines 18.

Figure 2:
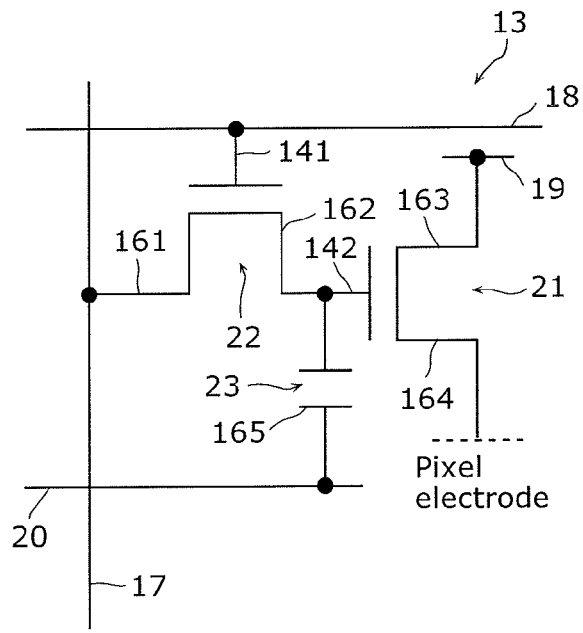
FIG. 2 is a diagram showing the circuit configuration of a pixel circuit according to Embodiment 1.

Next, the configuration of the pixel 13 in the organic EL display apparatus 10 shall be described with reference to FIG. 2. FIG. 2 is a diagram showing the circuit configuration of the pixel circuit 13 according to Embodiment 1. As shown in FIG. 2, the pixel circuit 13 includes a drive transistor 21, a switching transistor 22, and a capacitor (capacitor unit) 23. The transistor 21 is a transistor which drives an organic EL element, and the switching transistor 22 is a transistor for selecting a pixel.

In the switching transistor 22, a source electrode 161 is connected to the source line 17, a gate electrode 141 is connected to the gate line 18, and a drain electrode 162 is connected to the capacitor 23 and a gate electrode 142 of the drive transistor 21. Furthermore, in the drive transistor 21, a drain electrode 163 is connected to a power source line 19, and a source electrode 164 is connected to the pixel electrode 14.

It should be noted that since the drive transistor 21 and the switching transistor 22 are described as N-type transistors in Embodiment 1, the source electrode and the drain electrode have the wiring shown in FIG. 2. However, the source electrode and the drain electrode are determined according to the type of the thin-film transistor (P-type or N-type) and the relationship with the voltage applied to each electrode, and the above-described positional relationship is merely an example. Specifically, in the switching transistor 22 in FIG. 2, the side with the reference sign "161" may be the drain electrode and the side with the reference sign "162" may be the source electrode. At the same time, in the drive transistor 21 in FIG. 2, the side with the reference sign "163" may be the source electrode and the side with the reference sign "164" may be the drain electrode.

In addition, the electrode on one side of the capacitor 23 is connected to a single node inside the pixel circuit 13. In the example in FIG. 2, the electrode is connected to the gate electrode 142 and the drain electrode 162 of the switching transistor 22. Furthermore, the electrode on the other side of the capacitor 23 is connected to another node inside the pixel circuit 13 or to a common line 20. In the example in FIG. 2, the electrode is connected to the common line 20.

Figure 3:
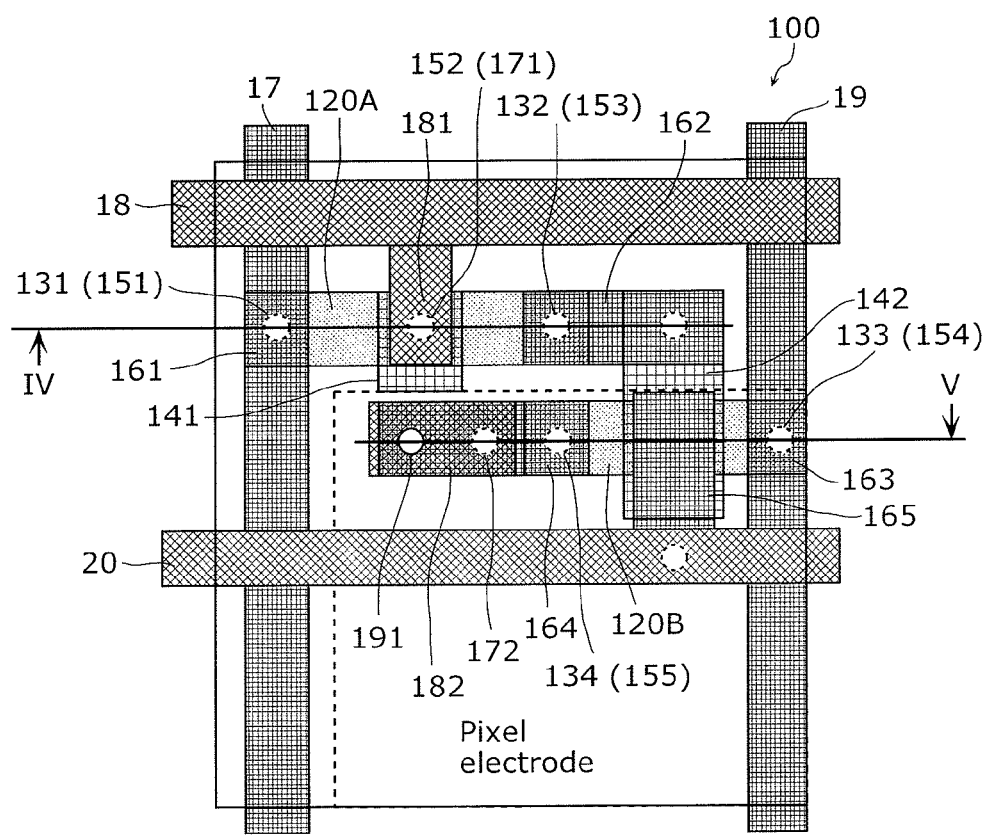
FIG. 3 is a plan view of a semiconductor device according to Embodiment 1.
Figure 4:
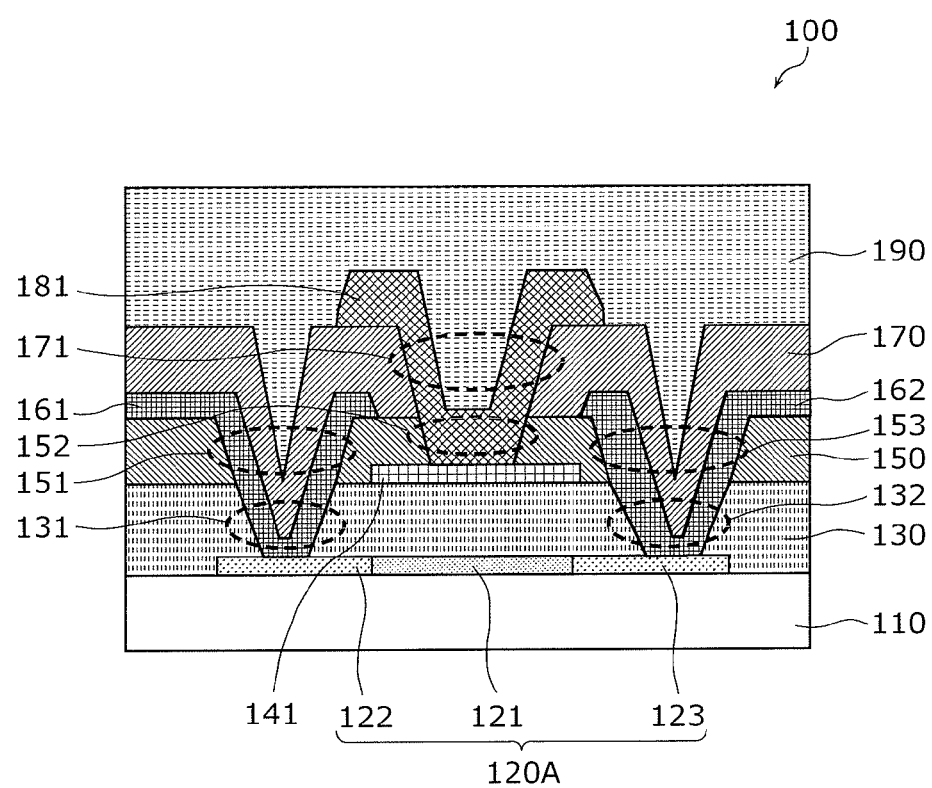
FIG. 4 is a view of the cross-section at a line IV in FIG. 3, as seen from the direction of the arrow.
Figure 5A:
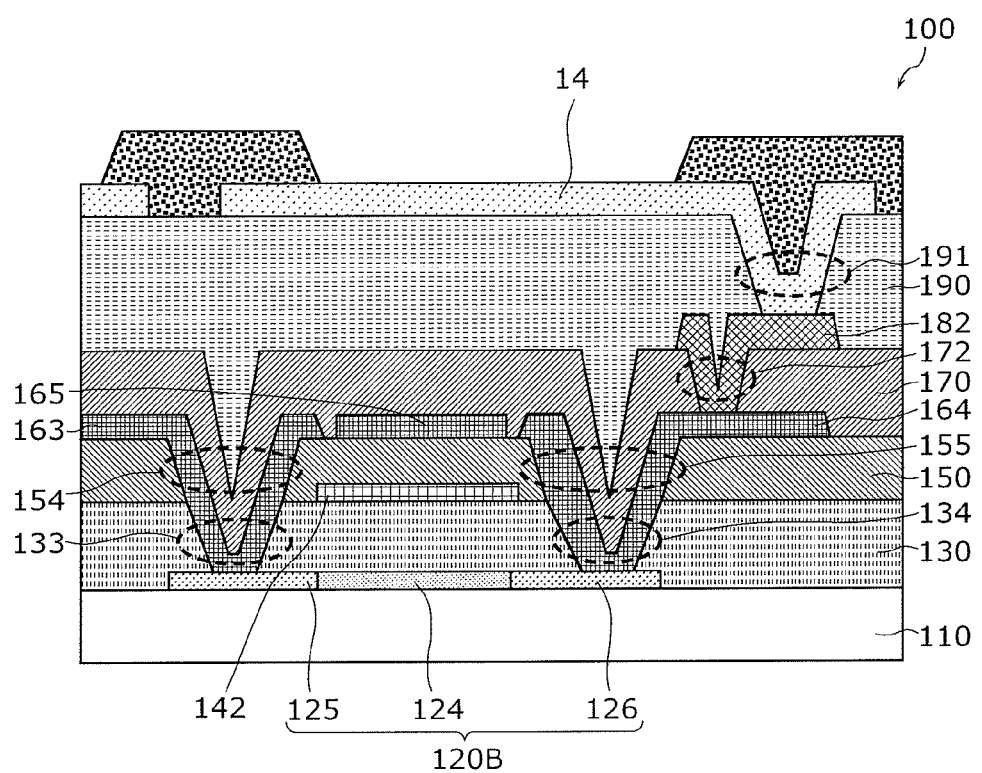
FIG. 5A is a view of the cross-section at a line V in FIG. 3, as seen from the direction of the arrow.
Figure 5B:
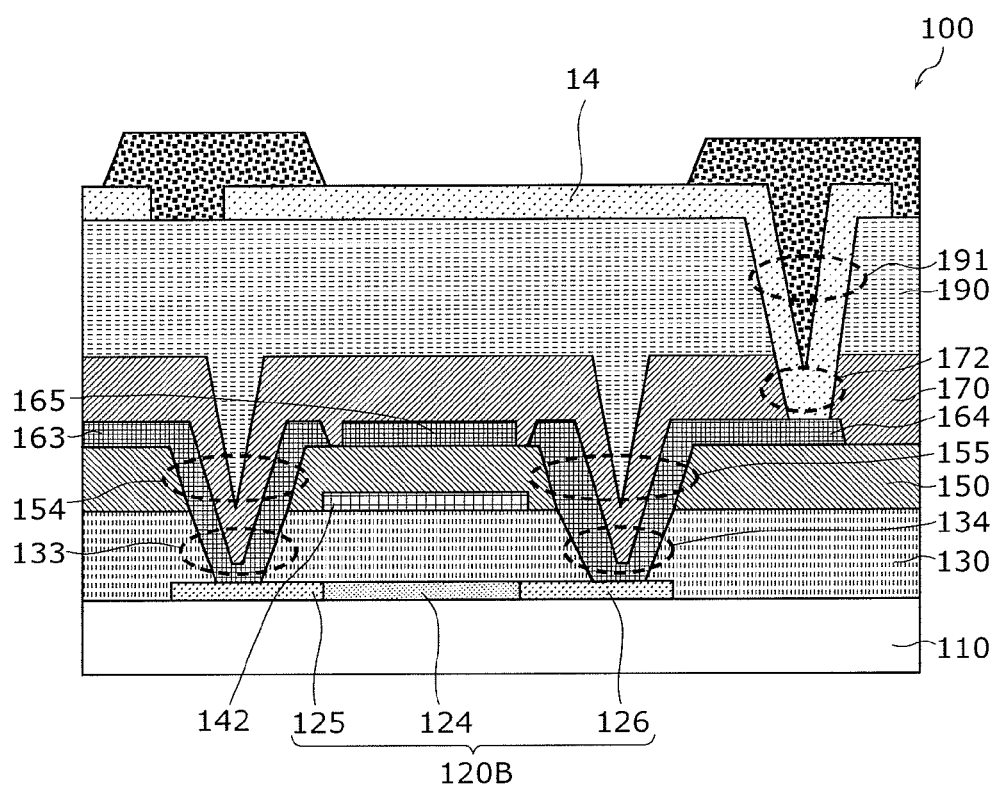
FIG. 5B is diagram showing an example in which a second connector electrode is omitted from FIG. 5A.
Figure 5C:
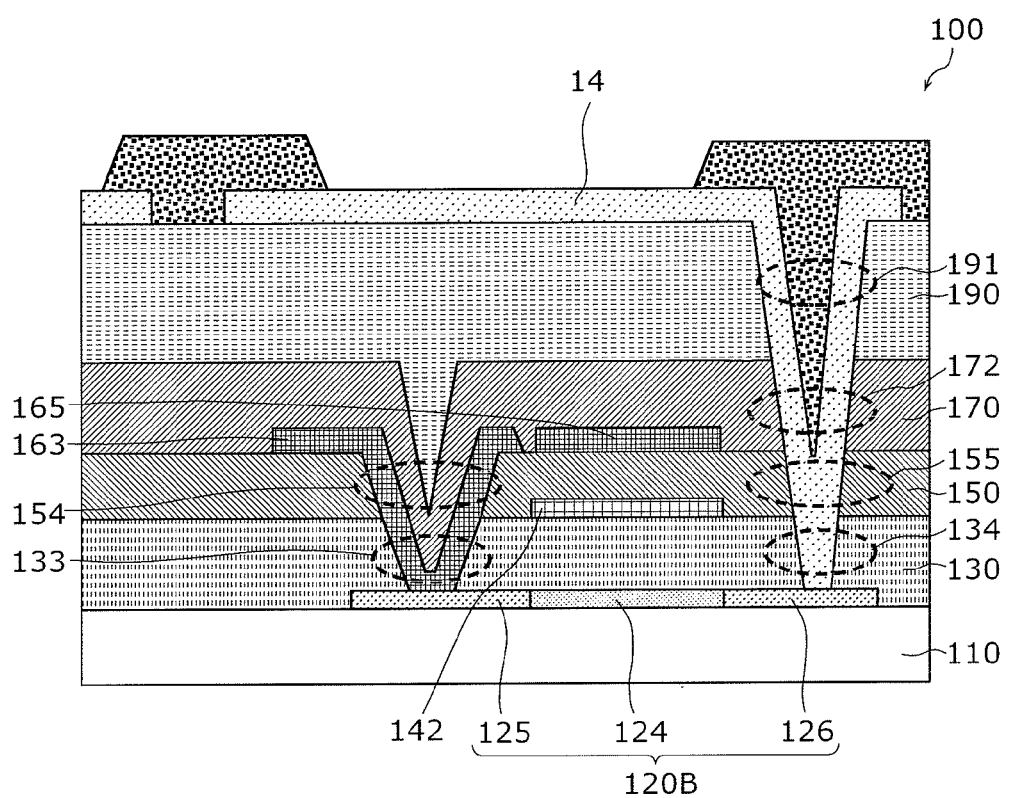
FIG. 5C is a diagram showing an example in which a source electrode is omitted from FIG. 5B.

In this configuration, when a gate signal is inputted to the gate line 18 and the switching transistor 22 is placed in the ON state, the signal voltage inputted to the source line 17 is stored in the capacitor 23 via the switching transistor 22. Furthermore, a certain potential is always applied from the common line 20 to the electrode on the other side of the capacitor 23. In addition, a holding voltage stored in the capacitor 23 is held throughout a 1-frame period. The holding voltage causes an analog change in the conductance of the drive transistor 21, and a drive current corresponding to the signal voltage flows from the anode to the cathode of the organic EL element. With this, the organic EL element emits light and a predetermined image can be displayed. Next, the configuration of the semiconductor device 100 according to Embodiment 1 shall be described with reference to FIG. 3 to FIG. 5C. FIG. 3 is a plan view of the semiconductor device 100 according to Embodiment 1. FIG. 4 is a view of the cross-section at a line IV in FIG. 3, as seen from the direction of the arrow. FIG. 5A is a view of the cross-section at a line V in FIG. 3, as seen from the direction of the arrow. FIG. 5B and FIG. 5C are diagrams showing other examples of FIG. 5A. It should be noted that the semiconductor device 100 shown in FIG. 3 to FIG. 5C is equivalent to the pixel circuit 13 in FIG. 2.

The semiconductor device 100 according to Embodiment 1 includes, stacked in the following order, a substrate 110; semiconductor layers 120A and 120B which include channel regions 121 and 124, and contact regions 122, 123, 125, and 126; a gate insulating film (first insulating film) 130, a first conducting layer including gate electrodes 141 and 142; a second insulating layer 150; a second conducting layer including source electrodes 161 and 164, drain electrodes 162 and 163, and a second capacitor electrode 165; a third insulating layer 170; a first connector electrode 181 and a second connector electrode 182; and a fourth insulating layer 190. Furthermore, FIG. 5A shows a pixel electrode 14 formed in a fourth conducting layer above the fourth insulating layer 190, and banks arranged in the borders of the respective pixels. It should be noted that contact holes 152 and 171 may be provided below the gate line 18, and the gate electrode 141 may be extended up to the positions of the contact holes 152 and 171.

The substrate 110 is a glass substrate comprising a glass material such as quartz glass, alkali-free glass, heat-resistant glass, or the like. Alternatively, the substrate 110 may be a plastic substrate or a flexible substrate in which an insulating body is formed above a metal film. It should be noted that, in order to prevent doping ions included in the glass substrate, such as natrium and phosphorus, from entering a crystalline silicon layer 54, an undercoat layer comprising a silicon nitride ($SiN_x$) film, a silicon oxide ($SiO_y$) film, a silicon oxynitride ($SiO_yN_x$) film, or the like, may be formed on the substrate 110. Furthermore, the undercoat layer also serves to lessen the effects of heat on the substrate 110, in high-temperature heat treatment processes such as laser annealing. The thickness of the undercoat layer can be set to approximately 10 nm to 100 nm, for example.

The semiconductor layers 120A and 120B are formed above the substrate 110, and include the channel regions 121 and 124 respectively, and the pairs of contact regions 122 and 123, and 125 and 126, respectively. The thickness of the semiconductor layers 120A and 120B can be set to approximately 30 nm to 100 nm, for example.

The channel regions 121 and 124 are regions for which the number of carriers is controlled by the voltage of the gate electrodes 141 and 142, respectively. Each of the channel regions 121 and 124 is a crystalline silicon thin-film having a crystalline organizational structure, and comprises a microcrystalline silicon thin-film or a polycrystalline silicon structure. The channel regions 121 and 124 can be formed through crystallization of non-crystalline silicon (amorphous silicon), for example.

The contact regions 122, 123, 125, and 126 are non-crystalline semiconductor films containing a high concentration of doping ions, and are $n^+$ layers containing a high concentration of doping ions. More specifically, the contact regions 122, 123, 125, and 126 of the N-type drive transistor 21 and switch transistor 22 can be formed using an N-type semiconductor film obtained by doping amorphous silicon with phosphorus (P) as doping ions. On the other hand, the contact regions 122, 123, 125, and 126 in the case where the drive transistor 21 and switch transistor 22 are assumed to be P-type transistors can be formed using a P-type semiconductor film obtained by doping amorphous silicon with boron (B) as doping ions.

It should be noted that a lightly doped region (LDR) may be formed between the contact regions 122, 123, 125, and 126 and the channel regions 121 and 124. The lightly doped region is doped with phosphorus. The above-described 2 layers may be continuously formed in a chemical vapor deposition (CVD) apparatus.

The gate insulating film (first insulating film) 130 is formed above the entirety of the substrate 110 so as to cover the semiconductor layers 120A and 120B. Furthermore, contact holes 131, 132, 133, and 134 are formed at positions overlapping with the contact regions 122, 123, 125, and 126, respectively.

The gate insulating film 130 can be formed using, for example, a single-layer film of an oxide or a nitride, such as a silicon oxide ($SiO_y$), a silicon nitride ($SiN_x$), a silicon oxynitride ($SiO_yN_x$), an aluminum oxide ($AlO_z$), or a tantalum oxide ($TaO_w$), or a layered film thereof. It should be noted that the second insulating layer 150, the third insulating layer 170, and the fourth insulating layer 190 can also be formed using the aforementioned materials.

The gate electrode 141 of the first conducting layer is formed by patterning, at a position which overlaps with the channel region 121 of the semiconductor layer 120A which is below the gate insulating film 130. The gate electrode 142 of the first conducting layer is formed by patterning, at a position which overlaps with the channel region 124 of the semiconductor layer 120B which is below the gate insulating film 130.

The first conducting layer (gate electrodes 141 and 142) can be formed using, for example, molybdenum (Mo), aluminum (Al), copper (Cu), tungsten (W), titanium (Ti), chromium (Cr), molybdenum-tungsten (MoW), or the like. The thickness of the gate electrodes 141 and 142 can be set to approximately 20 nm to 500 nm, for example. Furthermore, the gate electrode 142 also functions as a first capacitor electrode of the capacitor 23.

The second insulating layer 150 is formed above the gate insulating film 130 so as to cover the gate electrodes 141 and 142. Furthermore, contact holes 151, 153, 154, and 155 are formed in the second insulating layer 150 so as to be connected, respectively, with the contact holes 131, 132, 133, 134 of the gate insulating film 130. In addition, a contact hole 152 is formed at a position in the second insulating layer 150 which overlaps with the gate electrode 141 and the channel region 121 of the semiconductor layer 120A.

The source electrodes 161 and 164, the drain electrodes 162 and 163, and the second capacitor electrode 165 of the second conducting layer are formed above the second insulating layer 150 by patterning. Furthermore, although illustration has been omitted in FIG. 4 and FIG. 5A, the source line 17 and the power source line 19 are arranged parallel to each other in the second conducting layer.

The second conducting layer can have a single-layer structure or a multi-layer structure comprising a conductive material, an alloy of conductive materials, or the like. For example, the second conducting layer can be formed using aluminum (Al), gold (Au), molybdenum (Mo), tungsten (W), copper (Cu), titanium (Ti), chromium (Cr), or the like. In Embodiment 1, the second conducting layer is formed using a MoW/Al/Mo three-layer structure. The thickness of the second conducting layer can be set to approximately 100 nm to 1000 nm, for example.

The source electrode 161 is formed at a position which overlaps with the contact holes 131 and 151, and is connected to the contact region 122 of the semiconductor layer 120A through the contact holes 131 and 151. Furthermore, the source electrode 161 is connected to the source line 17 (not shown in FIG. 4) formed in the same layer (that is, the second conducting layer) as the source electrode 161.

The drain electrode 162 is formed at a position which overlaps with the contact holes 132 and 153, and is connected to the contact region 123 of the semiconductor layer 120A through the contact holes 132 and 153. Furthermore, the drain electrode 162 is connected to the gate electrode 142 through a contact hole (not shown in the figure) formed in the gate insulating film 130.

The drain electrode 163 is formed at a position which overlaps with the contact holes 133 and 154, and is connected to the contact region 125 of the semiconductor layer 120B through the contact holes 133 and 154. Furthermore, the drain electrode 163 is connected to the power source line 19 (not shown in FIG. 5A) formed in the same layer (that is, the second conducting layer) as the drain electrode 163.

The source electrode 164 is formed at a position which overlaps with the contact holes 134 and 155, and is connected to the contact region 126 of the semiconductor layer 120B through the contact holes 134 and 155. Furthermore, the source electrode 164 is connected to the pixel electrode 14 formed in the fourth conducting layer, via the second connector electrode 182.

The second capacitor electrode 165 is formed at a position which overlaps with the gate electrode 142 which functions as the first capacitor electrode, and is connected to the common line 20 (not shown in FIG. 5A) formed in a third conducting layer, through a contact hole (not shown in the figure). Furthermore, a first conducting layer pattern and a second conducting layer pattern are provided in a location other than that above the channel region 124 and in such a way as to overlap with each other. The first conducting layer pattern and the second conducting layer pattern may be made to function as the first capacitor electrode and the second capacitor electrode, respectively, so as to serve as the capacitor 23.

The region of the second insulating layer 150 that is located between the first capacitor electrode 142 and second capacitor electrode 165 functions as a dielectric of the capacitor 23. Here, it is preferable that the per-unit area electrostatic capacitance of the second insulating layer 150 be set to be larger than the per-unit area electrostatic capacitance of the third insulating layer 170.

In other words, the switching transistor 22 in FIG. 2 is a top gate thin-film transistor including the semiconductor layer 120A, the gate electrode 141, the source electrode 161, and the drain electrode 162. Furthermore, the drive transistor 21 in FIG. 2 is a top gate thin-film transistor including the semiconductor layer 120B, the gate electrode 142, the source electrode 164, and the drain electrode 163. In addition, the capacitor 23 in FIG. 2 includes the gate electrode 142 which functions as the first capacitor electrode, and the second capacitor electrode 165.

The third insulating layer 170 is stacked above the second insulating layer 150 so as to cover the source electrodes 161 and 164, the drain electrodes 162 and 163, and the second capacitor electrode 165. Furthermore, the contact hole 171 is formed at a position in the third insulating layer 170 which connects with the contact hole 152 of the second insulating layer 150. In addition, the contact hole 172 is formed at a position in the third insulating layer 170 which overlaps with the source electrode 164.

The first connector electrode 181 and the second connector electrode 182 of the third conducting layer are formed above the third insulating layer 170 by patterning. The third conducting layer can be formed using the same material as the second conducting layer, for example. It is preferable that the thickness of the third conducting layer be greater than the thickness of the second conducting layer, and can be set to approximately 300 nm to 2000 nm, for example. Furthermore, it is preferable that the sheet resistance (per-unit area resistance) of the third conducting layer be made less than the sheet resistance of the second conducting layer.

The first connector electrode 181 is formed at a position which overlaps with the contact holes 152 and 171, and is connected to the gate electrode 141 at a position which overlaps with the channel region 121 of the semiconductor layer 120A, through the contact holes 152 and 171. Furthermore, first connector electrode 181 is connected to the gate line 18 (not shown in FIG. 4) formed in the same layer (that is, the third conducting layer) as the first connector electrode 181. In other words, the first connector electrode 181 electrically connects the gate line 18 and the gate electrode 141.

The second connector electrode 182 is formed at a position which overlaps with the contact hole 172, and is connected to the source electrode 164. Furthermore, the second connector electrode 182 is connected to the pixel electrode 14 formed in the fourth conducting layer. In other words, the second connector electrode 182 electrically connects the pixel electrode 14 and the source electrode 164.

It should be noted that, as shown in FIG. 5B, the contact holes 172 and 191 may be formed so as to connect with each other, and the pixel electrode 14 and the source electrode 164 may be connected directly through the connected contact holes 172 and 191. In this case, the second connector electrode 182 in FIG. 5A can be omitted. In addition, as shown in FIG. 5C, the contact holes 134, 155, 172, and 191 may be formed so as to connect with one another, and the pixel electrode 14 and the contact region 126 of the semiconductor layer 120B may be connected directly through the connected contact holes 134, 155, 172, and 191. In this case, the pixel electrode 14 also functions as a source electrode, thus, the source electrode 164 in FIG. 5B can be omitted.

The fourth insulating layer 190 is stacked above the third insulating layer 170 so as to cover the first connector electrode 181 and the second connector electrode 182. Furthermore, the fourth insulating layer 190 may also be made to function as a planarizing film for planarizing the top surface of the semiconductor device 100. In order for the fourth insulating layer 190 to function as a planarizing film, it is preferable that the fourth insulating layer 190 be formed by stacking a simple substance or a mixture of a photosensitive resin of a polyimide series, polyacrylic, or the like. Furthermore, the aforementioned oxide film or nitride film may be deposited above or below the fourth insulating layer 190. In addition, in order to improve the flatness of the fourth insulating layer 190, it is preferable that the fourth insulating layer 190 be 500 nm to 10,000 nm in thickness. In addition, the contact hole 191 is formed at a position in the fourth insulating layer 190 which overlaps with the second connector electrode 182. The pixel electrode 14 is connected to the second connector electrode 182 through the contact hole 191.

The pixel electrode 14 of the fourth conducting layer is formed above the fourth insulating layer 190, as an independent pattern in each semiconductor device 100. In addition, the pixel electrode 14 is connected to the second connector electrode 182 through the contact hole 191. Furthermore, a bus line formed across plural semiconductor devices 100 (that is, plural pixel circuits 13) may be further formed in the fourth conducting layer. This bus line is connected to the common electrode 16 or the common line 20 at plural points to allow leveling of the potential difference between the central region and the peripheral region of the common electrode 16 or the common line 20.

Next, a method of fabricating the thin-film semiconductor device according to Embodiment 1 of the present invention shall be described with reference to FIG. 6A to FIG. 6H and FIG. 7A to FIG. 7J. FIG. 6A to FIG. 6H are schematic cross-sectional views of the structures in the cross-sections in FIG. 4, for the respective processes of the method of fabricating the thin-film semiconductor device according to Embodiment 1 of the present invention. FIG. 7A to FIG. 7J are schematic cross-sectional views of the structure in the cross-sections in FIG. 4, for the respective processes of the method of fabricating the thin-film semiconductor device according to Embodiment 1 of the present invention.

Figure 6A:
FIG. 6A is cross-sectional view for a substrate preparation process in a method of fabricating a thin-film semiconductor device according Embodiment 1, corresponding to FIG. 4.
Figure 7A:
FIG. 7A is cross-sectional view for the substrate preparation process in the method of fabricating the thin-film semiconductor device according Embodiment 1, corresponding to FIG. 5A.

First, as shown in FIG. 6A and FIG. 7A, the substrate 110 is prepared. It should be noted that an undercoat layer comprising a silicon oxide film, a silicon nitride film, a silicon oxynitride film, or the like, may be formed on the top surface of the substrate 110 using plasma CVD or the like.

Figure 6B:
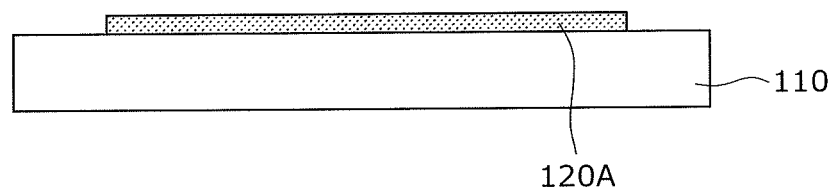
FIG. 6B is a cross-sectional view for a semiconductor layer forming process in the method of fabricating the thin-film semiconductor device according to Embodiment 1, corresponding to FIG. 4.
Figure 7B:
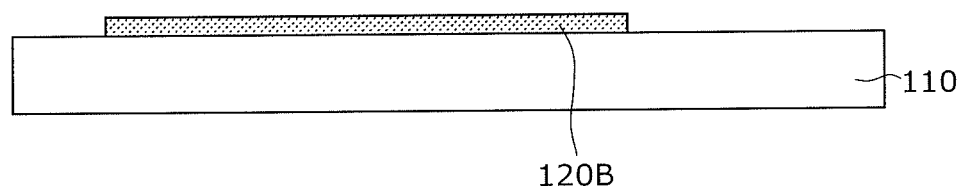
FIG. 7B is cross-sectional view for the semiconductor layer forming process in the method of fabricating the thin-film semiconductor device according Embodiment 1, corresponding to FIG. 5A.

Next, as shown in FIG. 6B and FIG. 7B, the semiconductor layers 120A and 120B are formed by patterning, on the entirety of the top surface of the substrate 110. Specifically, first, amorphous silicon (non-crystalline silicon) is deposited above the substrate 110 by plasma CVD or the like, and the amorphous silicon is crystallized into polycrystalline silicon (p-Si) having an average grain size of 50 nm or greater, by raising the temperature of the semiconductor layers 120A and 120B to a temperature range of 1,414 degrees Celsius which is the melting point of amorphous silicon, by heat annealing using an excimer laser or the like. Then, the semiconductor layers 120A and 120B can be formed by patterning the polycrystalline silicon.

Figure 6C:
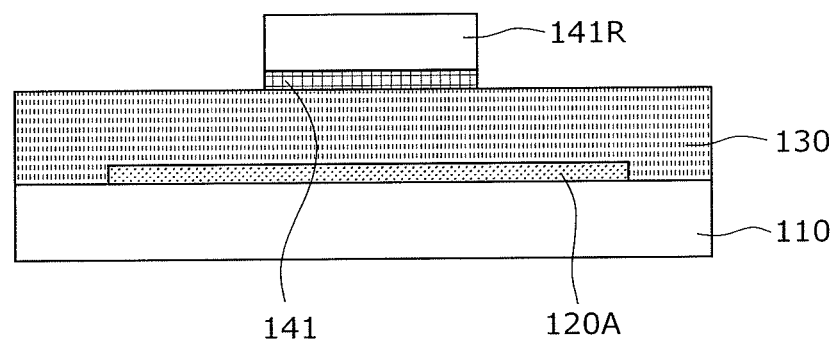
FIG. 6C is a cross-sectional view for a gate insulating film/gate electrode forming process in the method of fabricating the thin-film semiconductor device according to Embodiment 1, corresponding to FIG. 4.
Figure 7C:
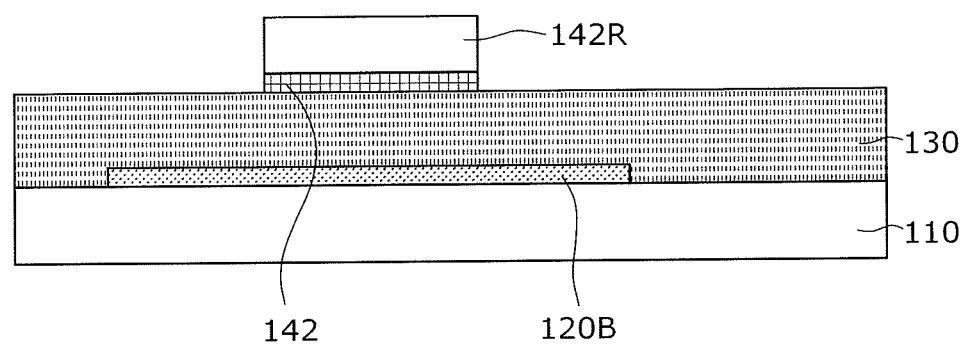
FIG. 7C is a cross-sectional view for the gate insulating film/gate electrode forming process in the method of fabricating the thin-film semiconductor device according to Embodiment 1, corresponding to FIG. 5A.

Next, as shown in FIG. 6C and FIG. 7C, the gate insulating film 130 is formed above the entirety of the top surface of the substrate 110 so as to cover the semiconductor layers 120A and 120B. In addition, the gate electrodes 141 and 142 are formed by patterning, at positions overlapping with the semiconductor layers 120A and 120B above the gate insulating film 130.

The gate insulating film 130 is deposited by depositing, for example, a film of silicon oxide by plasma CVD or the like. A film of silicon oxide can be deposited by introducing, for example, a predetermined concentration ratio of a silane ($SiH_4$) gas and nitrous oxide ($N_2O$) gas. The gate electrodes 141 and 142 can be formed in a predetermined shape, for example, by depositing a gate metal film comprising MoW above the gate insulating film 130 by sputtering, and patterning the gate metal film using a photolithography method and a wet-etching method or a dry-etching method. It should be noted that, in this process, resists 141R and 142R above the gate electrodes 141 and 142 are left behind without being removed.

Figure 6D:
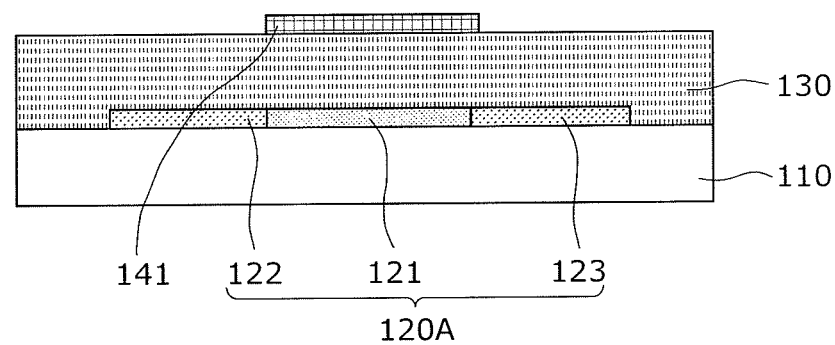
FIG. 6D is cross-sectional view for a channel region/contact region forming process in the method of fabricating the thin-film semiconductor device according Embodiment 1, corresponding to FIG. 4.
Figure 7D:
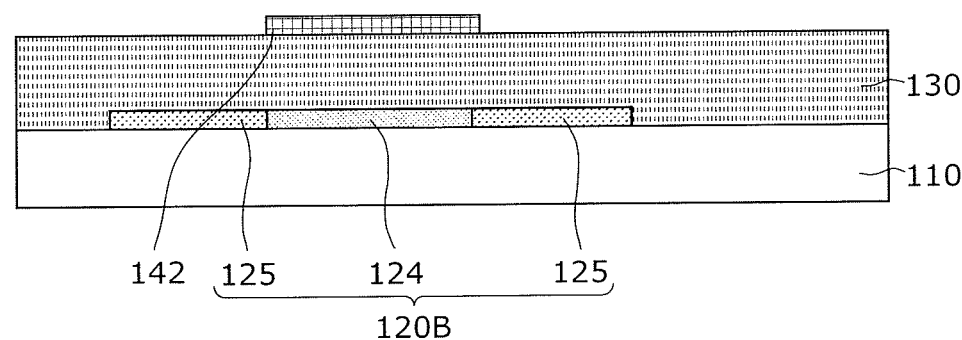
FIG. 7D is cross-sectional view for the channel region/contact region forming process in the method of fabricating the thin-film semiconductor device according Embodiment 1, corresponding to FIG. 5A.

Next, as shown in FIG. 6D and FIG. 7D, the channel regions 121 and 124, and the contact regions 122, 123, 125, and 126 are formed in the semiconductor layers 120A and 120B. Specifically, the regions of the semiconductor layers 120A and 120B which are to become the contact regions 122 and 123, and 125 and 126, respectively, are doped with a high concentration of doping ions such as a quinquevalent element such as phosphorus, or a triad such as boron. With this, the regions of the semiconductor layers 120A and 120B at the positions overlapping with the gate electrodes 141 and 142 become the p-Si channel regions 121 and 124, respectively, and the regions adjacent to the channel regions 121 and 124 become the contact regions 122 and 123, and 125 and 126, respectively.

Subsequently, when the gate electrodes 141 and 142 are further etched in the state where the resists 141R and 142R are left behind, the patterns of the gate electrodes 141 and 142 recede and become patterns that are smaller than the resists 141R and 142R. Subsequently, the resists 141R and 142R above the gate electrodes 141 and 142 are removed, and the semiconductor layers 120A and 120B are doped with a low concentration of doping ions such as a quinquevalent element such as phosphorus, or a triad such as boron.

Accordingly, since the concentration of electric fields between the channel regions 121 and 124, and the contact regions 122, 123, 125, and 126 can be avoided in the state where an OFF-state voltage is applied to the gate electrodes 141 and 142 of the switching transistor 22 and the drive transistor 21, OFF-state leakage current can be reduced.

Figure 6E:
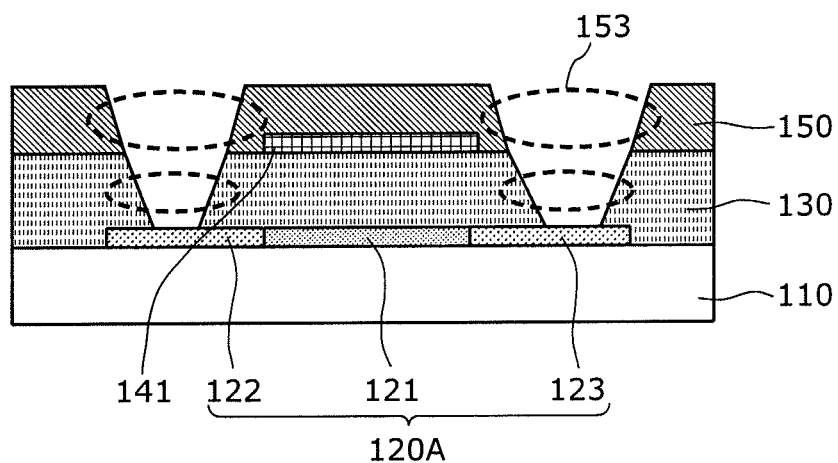
FIG. 6E is a cross-sectional view for a second insulating layer forming process in the method of fabricating the thin-film semiconductor device according to Embodiment 1, corresponding to FIG. 4.
Figure 7E:
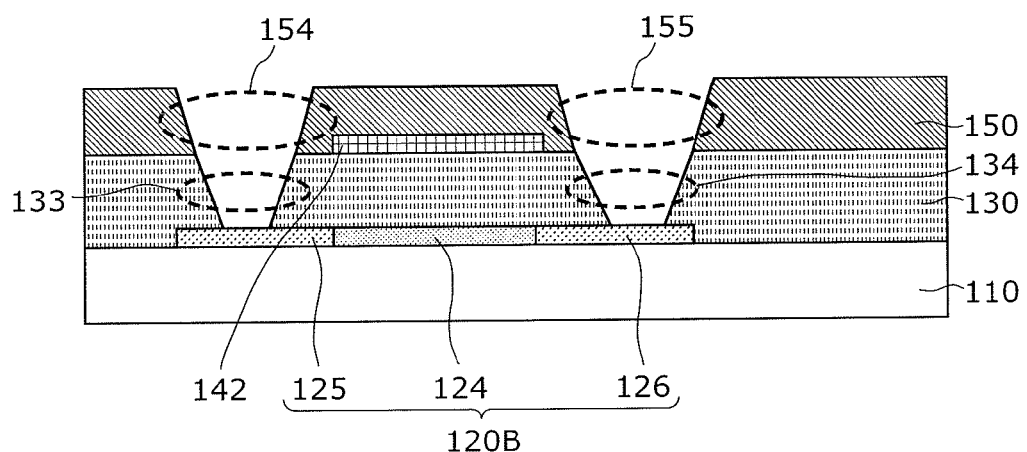
FIG. 7E is cross-sectional view for the second insulating layer forming process in the method of fabricating the thin-film semiconductor device according Embodiment 1, corresponding to FIG. 5A.

Next, as shown in FIG. 6E and FIG. 7E, the second insulating layer 150 is formed above the entirety of the top surface of the substrate 110 so as to cover the gate electrodes 141 and 142. Specifically, an insulating film which is to become the second insulating layer 150 is deposited by plasma CVD. Furthermore, by collectively etching the gate insulating film 130 and the second insulating layer 150, the contact holes 131, 132, 133, and 134 which penetrate through the gate insulating film 130 in the thickness direction, and the contact holes 151, 153, 154, and 155 which penetrate the second insulating layer 150 in the thickness direction are simultaneously formed so that corresponding ones of the contact holes are connected to each other. Here, by collectively etching the gate insulating film 130 and the second insulating layer 150, the alignment precision for the positions of the contact holes 151, 153, 154, and 155 with respect to the positions of the contact holes 131, 132, 133, and 134 becomes extremely high. As a result, the contact holes 131, 132, 133, 134, 151, 153, 154, and 155 can be formed in smaller regions.

Figure 6F:
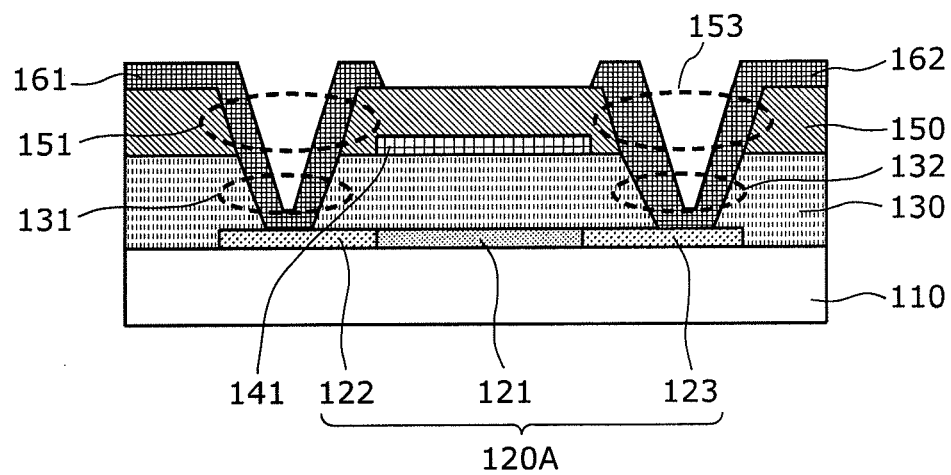
FIG. 6F is a cross-sectional view for a source electrode/drain electrode forming process in the method of fabricating the thin-film semiconductor device according to Embodiment 1, corresponding to FIG. 4.
Figure 7F:
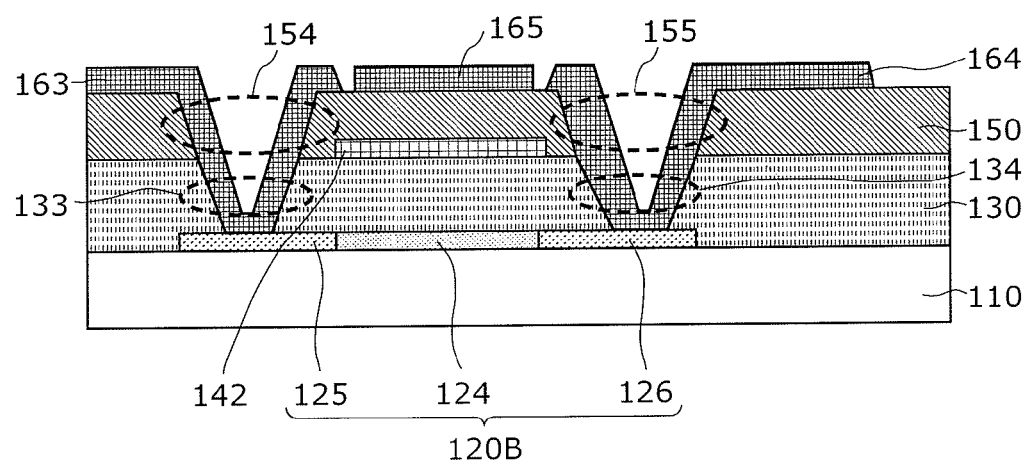
FIG. 7F is a cross-sectional view for the source electrode/drain electrode forming process in the method of fabricating the thin-film semiconductor device according to Embodiment 1, corresponding to FIG. 5A.

Next, as shown in FIG. 6F and FIG. 7F, the source electrodes 161 and 164, the drain electrodes 162 and 163, and the second capacitor electrode 165 are formed by patterning, above the second insulating layer 150. Specifically, a source/drain metal film comprising a material which is to become the source electrodes 161 and 164, the drain electrodes 162 and 163, and the second capacitor electrode 165 is deposited by sputtering or the like, and the source/drain metal film is patterned into a predetermined shape. Furthermore, in this process, the source line 17 and the power source line 19 are also formed by patterning.

With this, the source electrode 161 is formed at a position which overlaps with the contact holes 131 and 151; the drain electrode 162 is formed at a position which overlaps with the contact holes 133 and 153; the drain electrode 163 is formed at a position which overlaps with the contact holes 133 and 154; the source electrode 164 is formed at a position which overlaps with the contact holes 134 and 155; and the second capacitor electrode 165 is formed at a position which overlaps with the gate electrode 142 which functions as a first capacitor electrode.

Furthermore, each of the source electrodes 161 and 164 and the drain electrodes 162 and 163 are connected to the corresponding one of the contact regions 122, 123, 125, 126, through the contact holes 131, 132, 133, 134, 151, 153, 154, and 155.

Figure 6G:
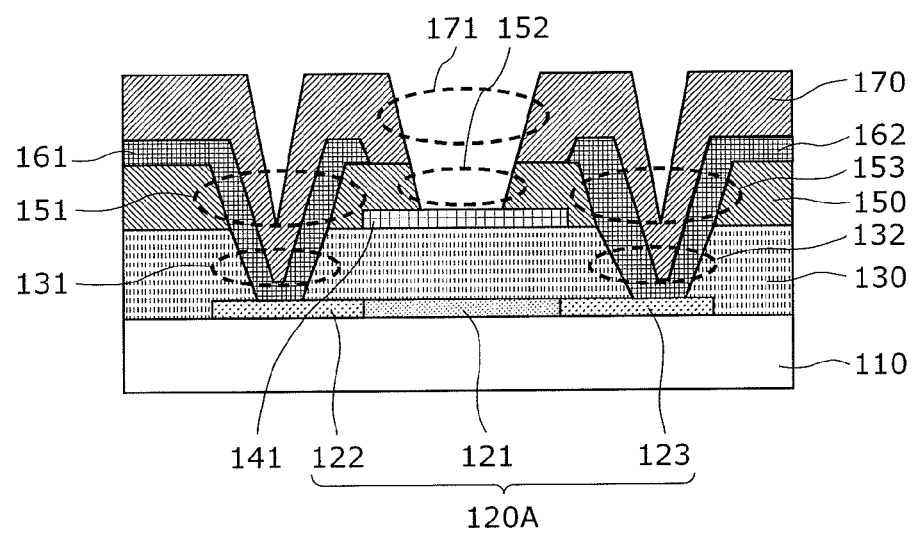
FIG. 6G is a cross-sectional view for a third insulating layer forming process in the method of fabricating the thin-film semiconductor device according to Embodiment 1, corresponding to FIG. 4.
Figure 7G:
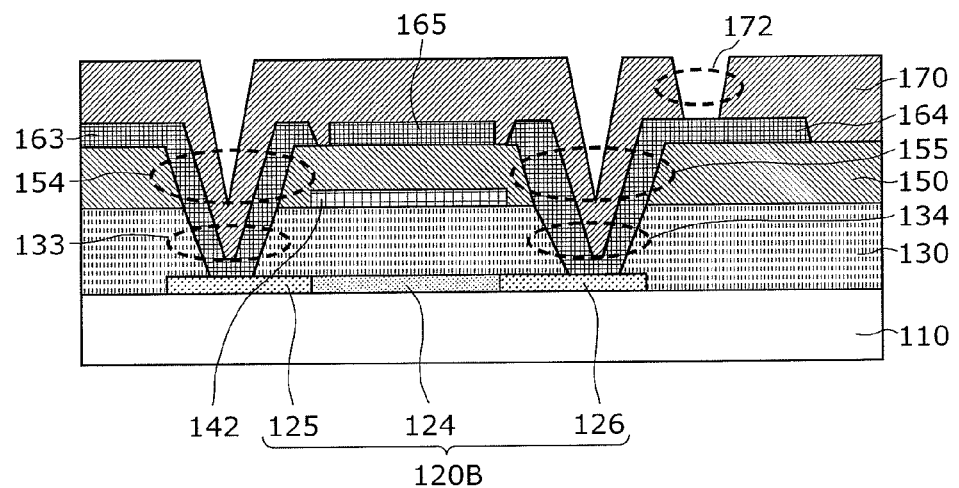
FIG. 7G is cross-sectional view for the third insulating layer forming process in the method of fabricating the thin-film semiconductor device according Embodiment 1, corresponding to FIG. 5A.

Next, as shown in FIG. 6G and FIG. 7G, the third insulating layer 170 is formed above the entirety of the top surface of the substrate 110 so as to cover the source electrodes 161 and 164, the drain electrodes 162 and 163, and the second capacitor electrode 165. Specifically, an insulating film which is to become the third insulating layer 170 is deposited by plasma CVD. Furthermore, by collectively etching the second insulating layer 150 and the third insulating layer 170, the contact hole 152 penetrating through the second insulating layer 150 in the thickness direction and the contact hole 171 penetrating the third insulating layer 170 in the thickness direction are simultaneously formed so as to be connected with each other, as shown in FIG. 6G. Furthermore, at the same time, the contact hole 172, which penetrates the third insulating layer 170 in the thickness direction, is formed at a position in the third insulating layer 170 which overlaps with the source electrode 164, as shown in FIG. 7G.

Figure 6H:
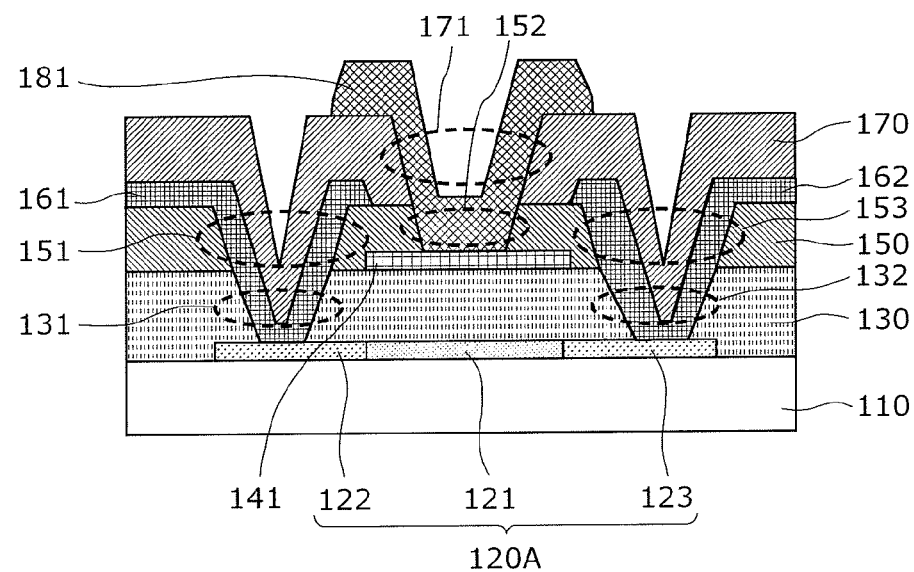
FIG. 6H is a cross-sectional view for a connector electrode forming process in the method of fabricating the thin-film semiconductor device according to Embodiment 1, corresponding to FIG. 4.
Figure 7H:
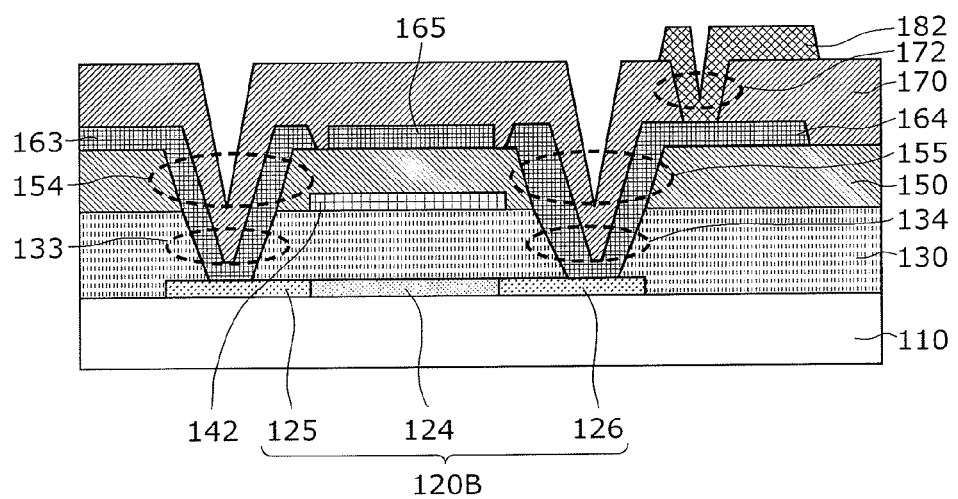
FIG. 7H is cross-sectional view for the connector electrode forming process in the method of fabricating the thin-film semiconductor device according Embodiment 1, corresponding to FIG. 5A.

Next, as shown in FIG. 6H and FIG. 7H, the first connector electrode 181 and the second connector electrode 182 are formed above the third insulating layer 170 by patterning. Specifically, a metal film comprising the material which is to become the first connector electrode 181 and the second connector electrode 182 is deposited by sputtering or the like, and the metal film is patterned into a predetermined shape. Furthermore, in this process, the gate line 18 and the common line 20 are also formed by patterning.

With this, the first connector electrode 181 is formed at a position which overlaps with the contact holes 152 and 171, and the second connector electrode 182 is formed at a position which overlaps with the contact hole 172. Furthermore, the first connector electrode 181 is connected to the gate electrode 141 through the contact hole 152 and 172. In addition, the second connector electrode 182 is connected to the source electrode 164 through the contact hole 172.

Figure 7I:
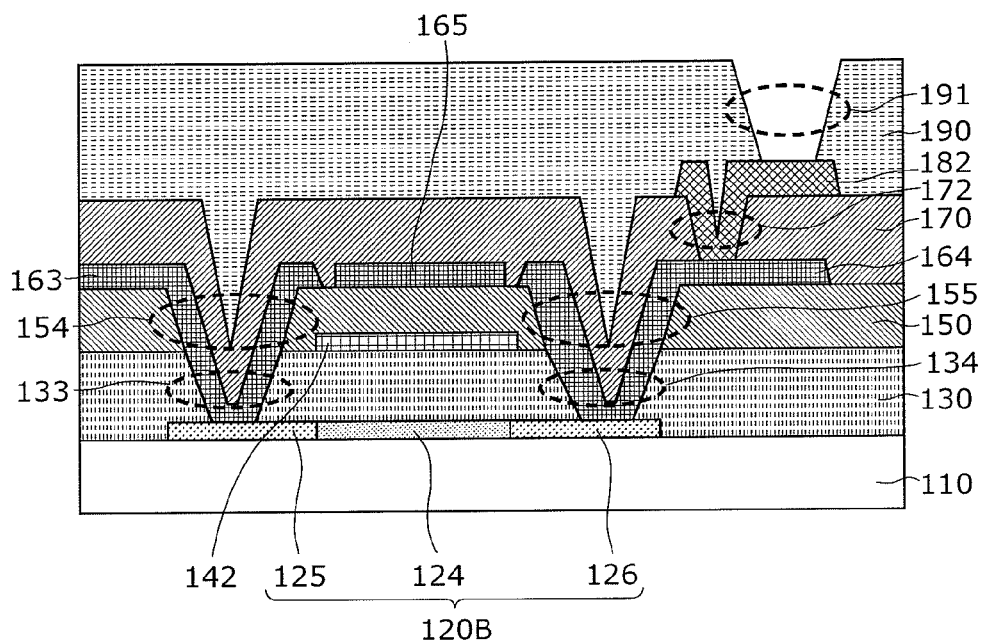
FIG. 7I is a cross-sectional view for the fourth insulating layer forming process in the method of fabricating the thin-film semiconductor device according to Embodiment 1, corresponding to FIG. 5A.

Next, as shown in FIG. 7I, the fourth insulating layer 190 is formed on the entirety of the pixel region of the substrate 110 so as to cover the first connector electrode 181 and the second connector electrode 182. Specifically, after applying a photosensitive resin of a polyimide series, polyacrylic, or the like, a pattern is formed by exposing and developing through a photo mask, and stabilized by heating. With this, the top surface of the deposited interlayer insulating film is planarized, and a contact hole 190 penetrating through the fourth insulating layer 190 in the thickness direction is formed in a position which overlaps with the second connector electrode 182.

Figure 7J:
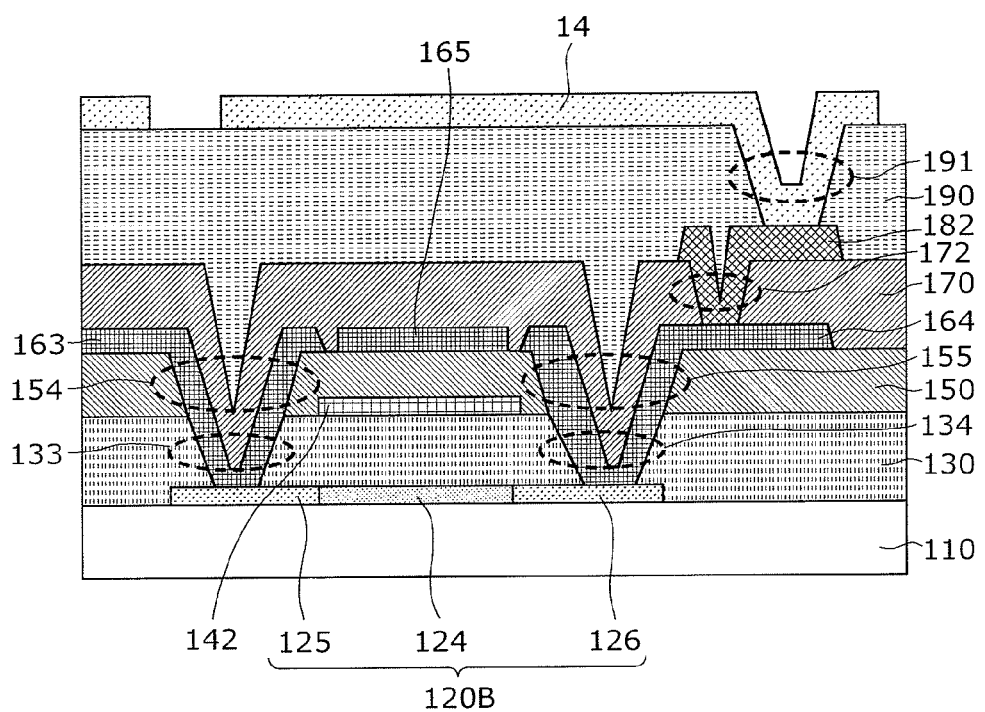
FIG. 7J is cross-sectional view for an anode forming process in the method of fabricating the thin-film semiconductor device according Embodiment 1, corresponding to FIG. 5A.

Next, as shown in FIG. 7J, the pixel electrode 14 is formed above the fourth insulating layer 190 by patterning. Specifically, a metal film comprising the material which is to become the pixel electrode 14 is deposited by sputtering or the like, and the metal film is patterned into a predetermined shape. With this, the pixel electrode 14 is connected to the second connector electrode 182 through the contact hole 191. Then, by forming banks in predetermined intervals above the pixel electrode 14, the semiconductor device 100 shown in FIG. 3 to FIG. 5A can be obtained.

As in the above-described configuration, by forming the gate electrodes 141 and 142 in the first conducting layer and forming the gate line 18 in the third conducting layer, the gate electrodes 141 and 142 and the gate line 18 are configured using a material suitable for each one. For example, when crystallizing the channel regions 121 and 122 by heat annealing, it is sufficient to form the gate electrodes 141 and 142 to be formed in the first conducting layer by using a material having high heat resistance capable of resisting high temperatures from 1,100 to 1,414 degrees Celsius. On the other hand, since high heat resistance is not required for the gate line 18 formed in the third conducting layer after heat annealing, it is sufficient to form the gate line 18 by using a low resistance metal. Furthermore, it is sufficient to form the source line 17 and the power source line 19, which are formed in the second conducting layer, and the common line 20 formed in the third conducting layer, by likewise using a low resistance metal.

Furthermore, the source line 17 and the power source line 19 which are formed in the second conducting layer are arranged parallel to each other, and the gate line 18 and the common line 20 which are formed in the third conducting layer are arranged parallel to each other. In addition, the source line 17 and the power source line 19 are arranged to cross with the gate line 18 and the common line 20, and vice versa. Here, since the third insulating layer 170 is interposed between the second conducting layer and the third conducting layer, the crossing regions of the respective lines are insulated by the third insulating layer 170. Therefore, as described above, by reducing the per-unit area electrostatic capacitance of the third insulating layer 170, the parasitic capacitance generated in the crossing regions of the respective lines can be reduced.

In addition, by forming capacitor electrodes of the capacitor 23 in the first conducting layer and the second conducting layer, a metal-insulator-metal (MIM) capacitor unit can be formed. At this time, by increasing the per-unit area electrostatic capacitance of the second insulating layer 150, a large capacity capacitor unit can be formed in a small area.

Specifically, by reducing the per-unit area electrostatic capacitance of the third insulating layer 170 and increasing the per-unit area electrostatic capacitance of the second insulating layer 150, the capacitor 23 having sufficient capacity can be realized in a limited area while reducing the wire time constant of the gate line 18 and the source line 17. Therefore, the 1-frame image display quality can be improved while improving the video display performance by raising frame frequency.

Next, modifications 1 to 8 of Embodiment 1 shall be described with reference to FIG. 8 to FIG. 16. It should be noted that the same reference sign is assigned to structural elements which are common to Embodiment 1 and other modifications, and detailed description shall be omitted.

(Modification 1)

Figure 8:
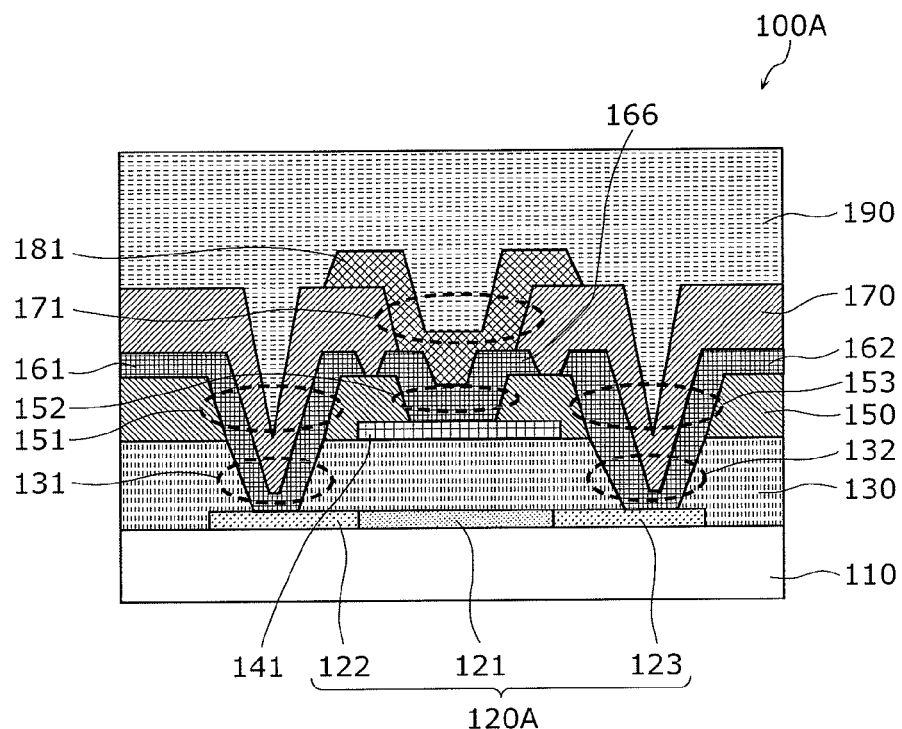
FIG. 8 is cross-sectional view of a semiconductor device according to Modification 1 of Embodiment 1, corresponding to FIG. 4.

FIG. 8 is cross-sectional view of a semiconductor device 100A according to Modification 1 of Embodiment 1, corresponding to FIG. 4. In FIG. 4, the gate electrode 141 formed in the first conducting layer is connected to the first connector electrode 181 formed in the third conducting layer, through the contact holes 152 and 171. In contrast, in the semiconductor device 100A shown in FIG. 8, a third connector electrode 166 is formed at a position in the second conducting layer which overlaps with the gate electrode 141 and the first connector electrode 181. In addition, the third connector electrode 166 is connected to the gate electrode 141 at a position which overlaps with the channel region 121 of the semiconductor layer 120A, through the contact hole 152. Furthermore, the first connector electrode 181 is connected to the third connector electrode 166 at a position which overlaps with the channel region 121 and the gate electrode 141, through the contact hole 171. With this, the gate line 18 and the gate electrode 141 are electrically connected.

It should be noted that although FIG. 8 shows an example in which the contact hole 171 is formed at a position which overlaps with the central region of the third connector electrode 166, and the first connector electrode 181 is connected to the central region of the third connector electrode, the present invention is not limited to this, and the contact hole 171 may be formed at a position which overlaps with a peripheral region of the third connector electrode 166, and the first connector electrode 181 may be connected to the peripheral region (that is, a position not overlapping with the channel region 121 and the gate electrode 141) of the third connector electrode.

(Modification 2)

Figure 9:
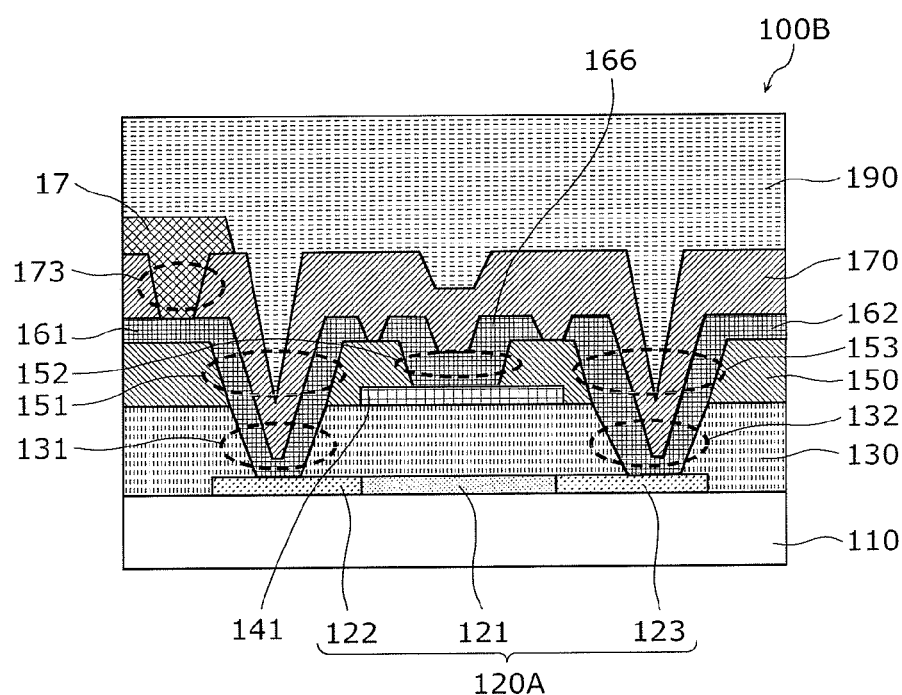
FIG. 9 is cross-sectional view of a semiconductor device according to Modification 2 of Embodiment 1, corresponding to FIG. 8.

FIG. 9 is cross-sectional view of a semiconductor device 100B according to Modification 2 of Embodiment 1, corresponding to FIG. 8. In the semiconductor device 100B shown in FIG. 9, the first connector electrode 181 in FIG. 8 is omitted, and the third connector electrode 166 is connected to the gate line 18 (illustration in FIG. 9 is omitted) formed in the second conducting layer. Furthermore, the source line 17 formed in the third conducting layer is connected to the source electrode 161 through a contact hole 173 formed at a position in the third insulating layer 170 which overlaps with the source electrode 161.

In other words, in the example in FIG. 9, the positional relationship of the source line 17 and the gate line 18 is different from that in Embodiment 1. In this manner, in the present invention, it is sufficient that one of the source line 17 and the gate line 18 is formed in the second conducting layer and the other is formed in the third conducting layer.

More specifically, in the case where the gate line 18 is formed in the third conducting layer as in Embodiment 1 for example, the line arranged parallel to the gate line 18 (for example, the common line 20) is formed in the third conducting layer, and the lines arranged to cross the gate line 18 (for example, the source line 17 and the power source line 19) are formed in one of the first conducting layer and the second conducting layer.

On the other hand, in the case where the gate line 18 is formed in the second conducting layer as in modification 2 for example, the line arranged parallel to the gate line 18 (for example, the common line 20) is formed in one of the first conducting layer and the second conducting layer, and the lines arranged to cross the gate line 18 (for example, the source line 17 and the power source line 19) are formed in the third conducting layer.

(Modification 3)

Figure 10:
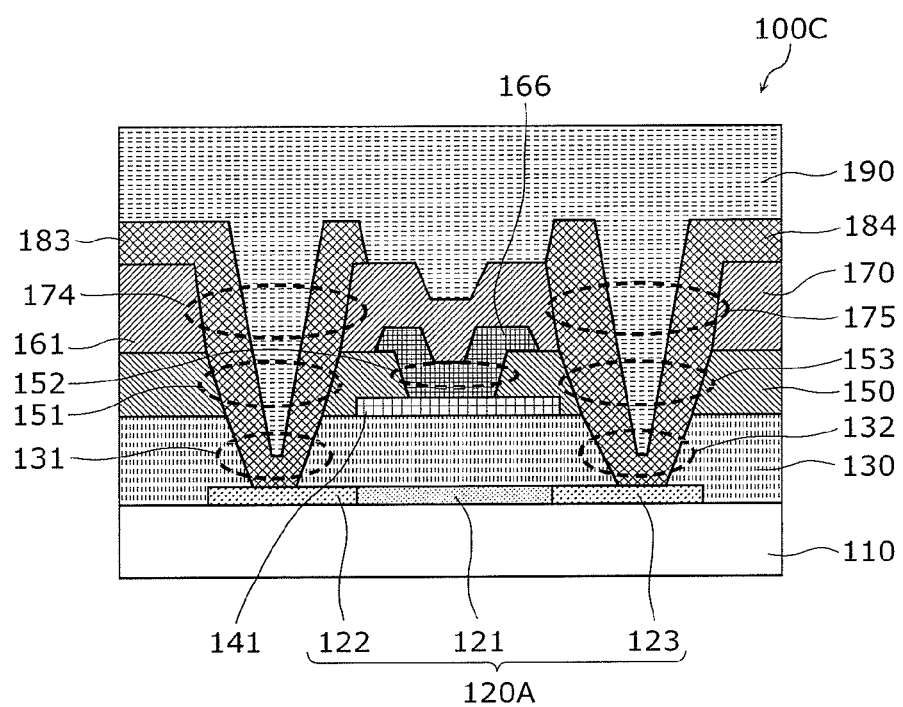
FIG. 10 is a cross-sectional view of a semiconductor device according to Modification 3 of Embodiment 1, corresponding to FIG. 9.

FIG. 10 is a cross-sectional view of a semiconductor device 100C according to Modification 3 of Embodiment 1, corresponding to FIG. 9. In the semiconductor device 100C shown in FIG. 10, a source electrode 183 (corresponding to the source electrode 161 in FIG. 9) and a drain electrode 184 (corresponding to the drain electrode 162 in FIG. 9) are formed in the third conducting layer; a contact hole 174 is formed at a position in the third insulating layer 170 which connects with the contact holes 131 and 151, and a contact hole 175 is formed at a position in the third insulating layer 170 which connects with the contact holes 132 and 153.

In addition, the source electrode 183 is connected to the contact region 122 through the contact holes 131, 151, and 174. Furthermore, the drain electrode 184 is connected to the contact region 123 through the contact holes 132, 153, and 175. It should be noted that the contact holes 131, 151, and 174 and the contact holes 132, 153, and 175 may be formed at the same time.

The source electrode and the drain electrode may be formed in the second conducting layer as in Embodiment 1, or may be formed in the third conducting layer as in Modification 3.

(Modification 4)

Figure 11:
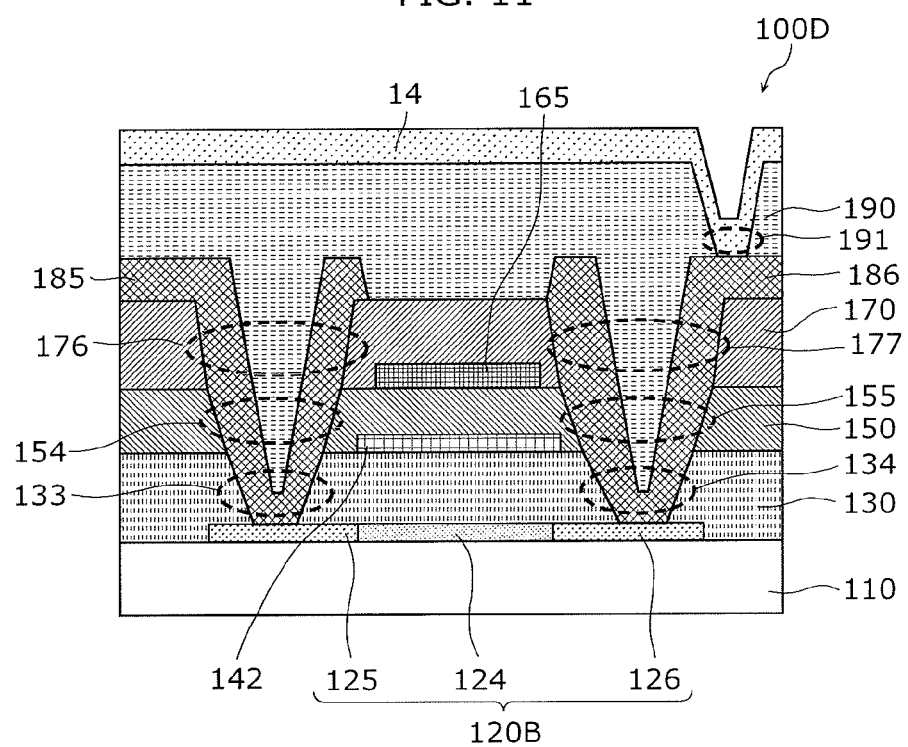
FIG. 11 is a cross-sectional view of a semiconductor device according to Modification 4 of Embodiment 1, corresponding to FIG. 5A.

FIG. 11 is a cross-sectional view of a semiconductor device 100D according to Modification 4 of Embodiment 1, corresponding to FIG. 5A. In the semiconductor device 100D shown in FIG. 11, a drain electrode 185 (corresponding to the drain electrode 163 in FIG. 5A) and a source electrode 186 (corresponding to the source electrode 164 in FIG. 5A) are formed in the third conducting layer; a contact hole 176 is formed at a position in the third insulating layer 170 which connects with the contact holes 133 and 154; and a contact hole 177 is formed at a position in the third insulating layer 170 which connects with the contact holes 134 and 155.

Then, the drain electrode 185 is connected to the contact region 125 through the contact holes 133, 154, and 176. Furthermore, the source electrode 186 is connected to the contact region 126 through the contact holes 134, 155, and 177. In addition, the pixel electrode 14 is connected directly to the source electrode 186 through the contact hole 191. It should be noted that the contact holes 134, 155, and 177 and the contact holes 133, 154, and 176 may be formed at the same time.

(Modification 5)

Figure 12:
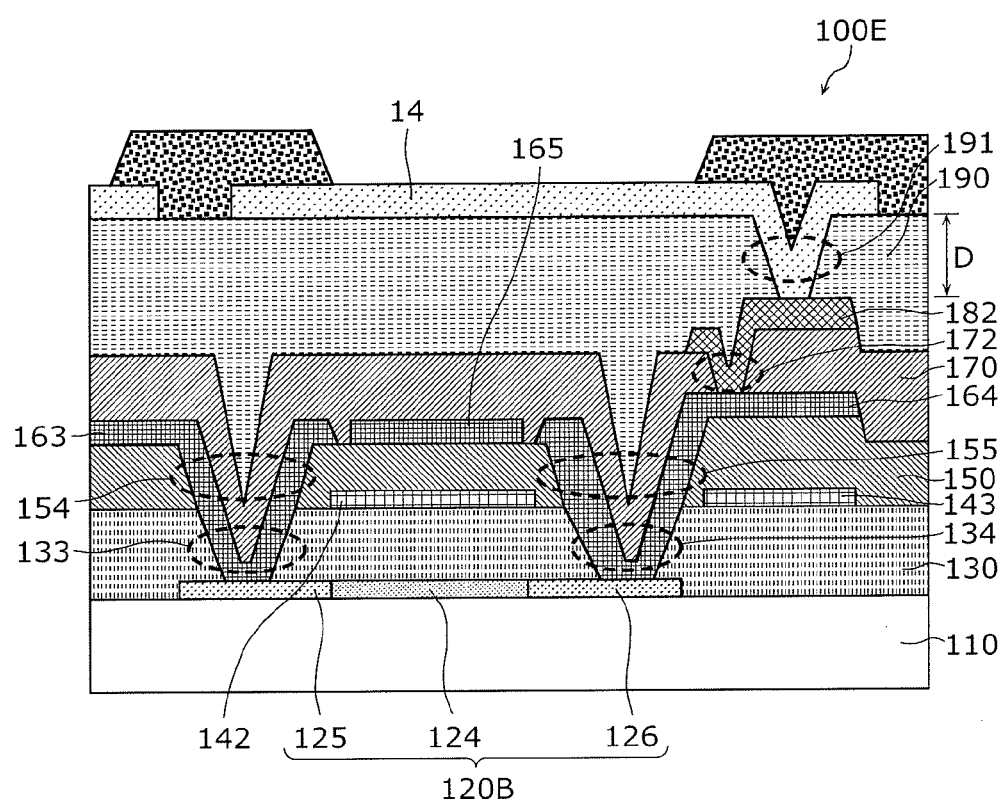
FIG. 12 is a cross-sectional view of a semiconductor device according to Modification 5 of Embodiment 1, corresponding to FIG. 5A.

FIG. 12 is a cross-sectional view of a semiconductor device 100E according to Modification 5 of Embodiment 1, corresponding to FIG. 5A. The semiconductor device 100D shown in FIG. 12 includes, in addition to the configuration in FIG. 5A, a height-adjustment layer 143 provided at a position in the first conducting layer which overlaps with the contact hole 191 By adopting the above-described configuration, the respective regions in the second insulating layer 150 and third insulating layer 170 which lie over the height-adjustment layer 143 are pushed up beyond the other regions. As a result, the depth $D_2$ of the contact hole 191 becomes less compared to that in FIG. 5A.

Here, the area of the upper opening of the contact hole 191 formed through the application and development of a photosensitive resin also decreases as the depth $D_2$ decreases. In this manner, by reducing the opening area of the contact hole 191 formed at a position which overlaps with a bank, the area of the unstable region in the shape of the pixel electrode 14 can be reduced, and the effective pixel electrode area can be increased as a result. In an organic EL panel, the unstable region in the shape of the pixel electrode 14 is covered by a bank and a light-emitting layer (not shown in the figure) is provided between adjacent banks, and thus the above-described configurations allows the area of the light-emitting layer to be increased.

Furthermore, although FIG. 12 shows an example in which the height-adjustment layer 143 is provided in the first conducting layer, the present invention is not limited to such configuration, and a height-adjustment layer may be provided in a layer that is in the same layer as the semiconductor layer 120B, at a position which overlaps with the contact hole 191. For example, in the example in FIG. 12, the part of the source electrode 164 which extends up to the position which overlaps with the contact hole 191 functions, not only as the source electrode 164, but also as a height-adjustment layer. It should be noted that the height-adjustment layer is not limited to one location, and a height-adjustment layer may be formed in one or both of the first conducting layer and a layer which is in the same layer as the semiconductor layer 120B.

In the same manner, when the third insulating layer 170 is formed by applying and developing a photosensitive resin so as to planarized the top surface of the third insulating layer 170, the height-adjustment layer 143 is provided in a position which overlaps with the contact hole 172. By adopting the above-described configuration, the region lying over the height-adjustment layer 143 is pushed up beyond the other regions. As a result, the depth of the contact hole 172 decreases compared to that in FIG. 5A, and the area of the upper opening decreases in the same manner as with the contact hole 191. Reducing the opening area of the contact hole 172 allows a wire formed in a third wiring layer, for example, the gate line 18, to be formed thick, and, as a result, wire resistance can be reduced.

(Modification 6)

Figure 13:
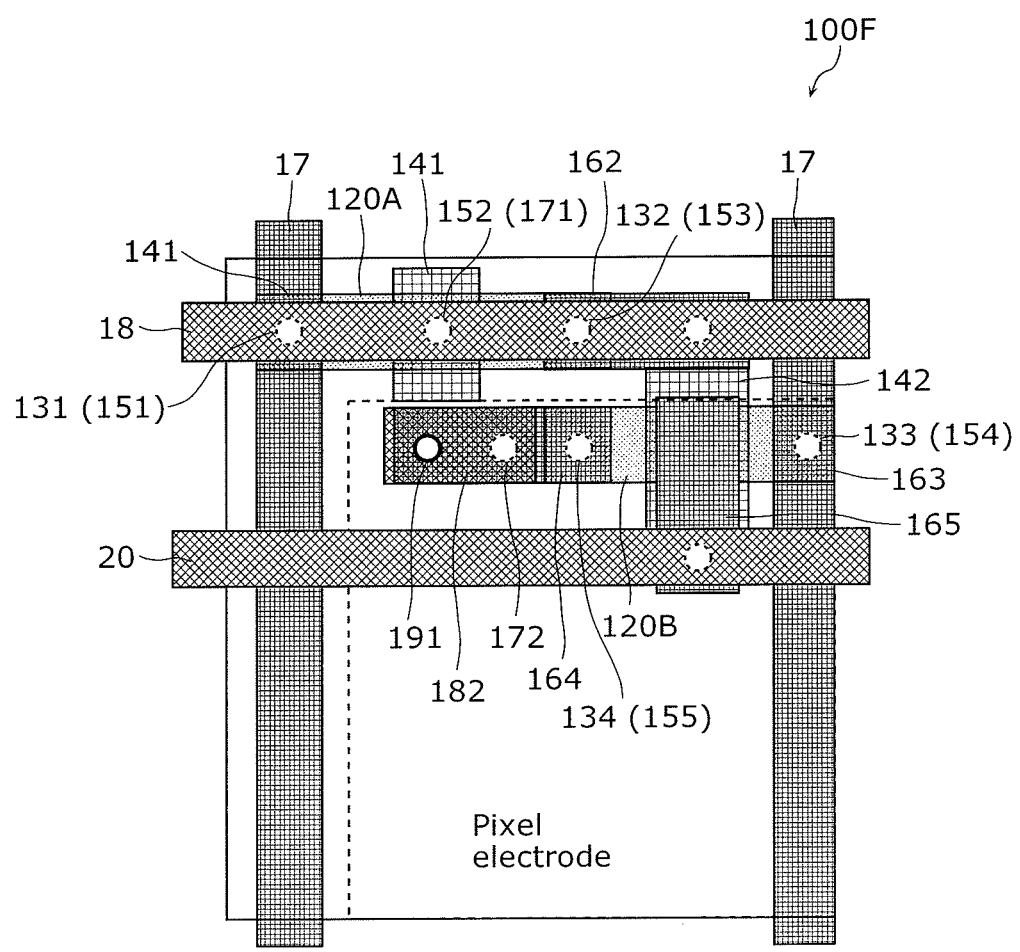
FIG. 13 is a cross-sectional view of a semiconductor device according to Modification 6 of Embodiment 1, corresponding to FIG. 3.

FIG. 13 is a cross-sectional view of a semiconductor device 100F according to Modification 6 of Embodiment 1, corresponding to FIG. 3. The semiconductor device 100F shown in FIG. 13 is different from that in FIG. 3 in that the gate line 18 is disposed at a position which overlaps with the gate electrode 141. With this, it is possible to omit the first connector electrode 181 in FIG. 3, and directly connect the gate line 18 and the gate electrode 141 through the contact holes 152 and 171.

(Modification 7)

Figure 14:
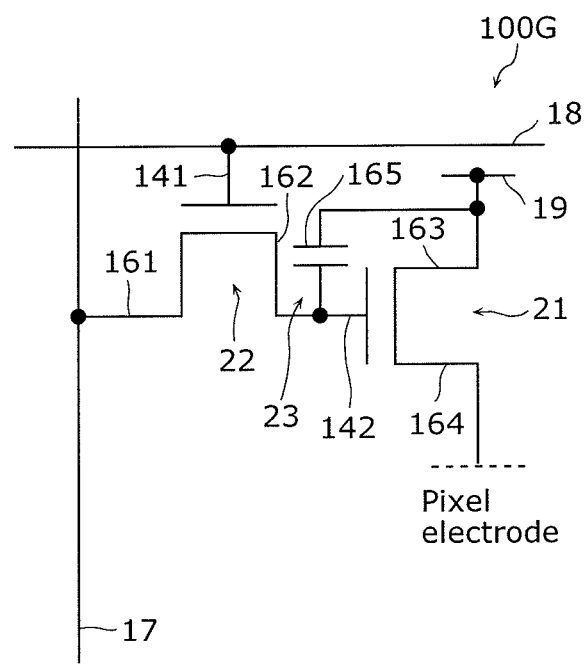
FIG. 14 is a circuit configuration diagram of a semiconductor device according to Modification 7 of Embodiment 1, corresponding to FIG. 2.
Figure 15:
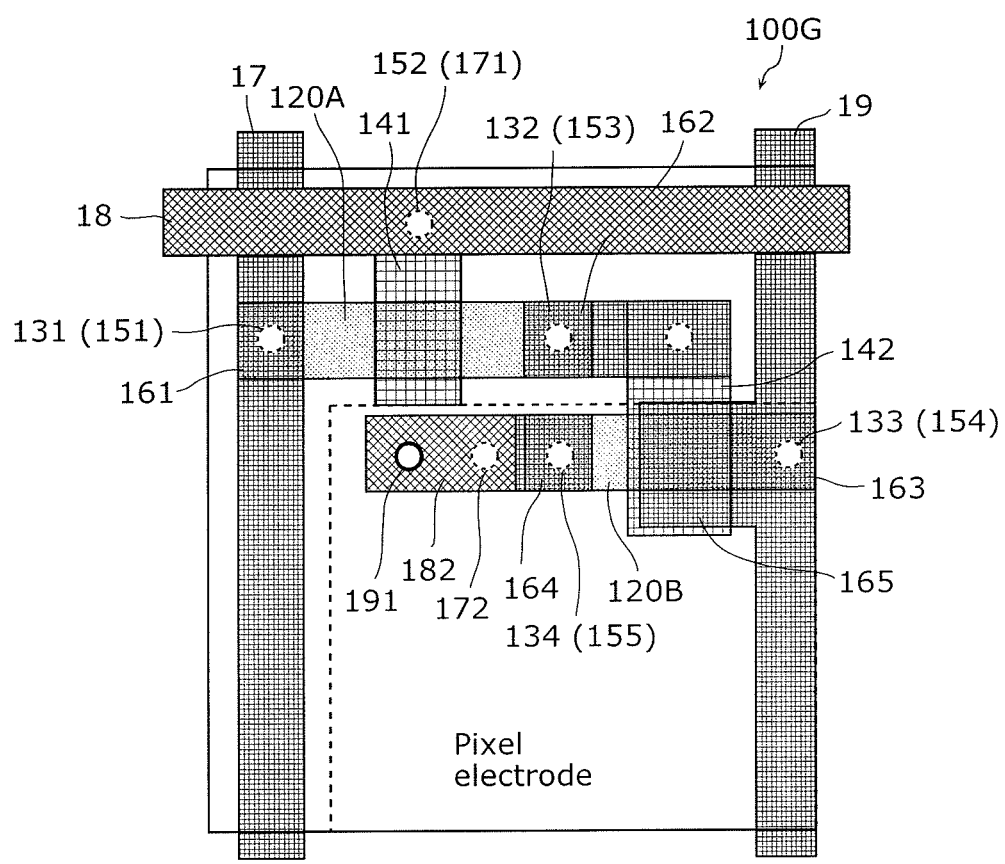
FIG. 15 is a plan view of the semiconductor device according to Modification 7 of Embodiment 1, corresponding to FIG. 3.

FIG. 14 and FIG. 15 are diagrams for a semiconductor device 100G according to Modification 7 of Embodiment 1, which correspond to FIG. 2 and FIG. 3, respectively. The semiconductor device 100G according to FIG. 14 and FIG. 15 is different from that shown in FIG. 2 and FIG. 3 in that the common line 20 is omitted and the second capacitor electrode 165 of the capacitor 23 is connected to the power source line 19.

Furthermore, in the semiconductor device 100G shown in FIG. 15, instead of omitting the first connector electrode 181 in FIG. 3, the gate electrode 141 is extended up to a position which overlaps with the gate line 18, and the gate line 18 and the gate electrode 141 are connected through the contact holes 152 and 171 formed at a position in which both the gate line 18 and the gate electrode 141 overlap (a position that does not overlap with the semiconductor layer 120A).

(Modification 8)

Figure 16:
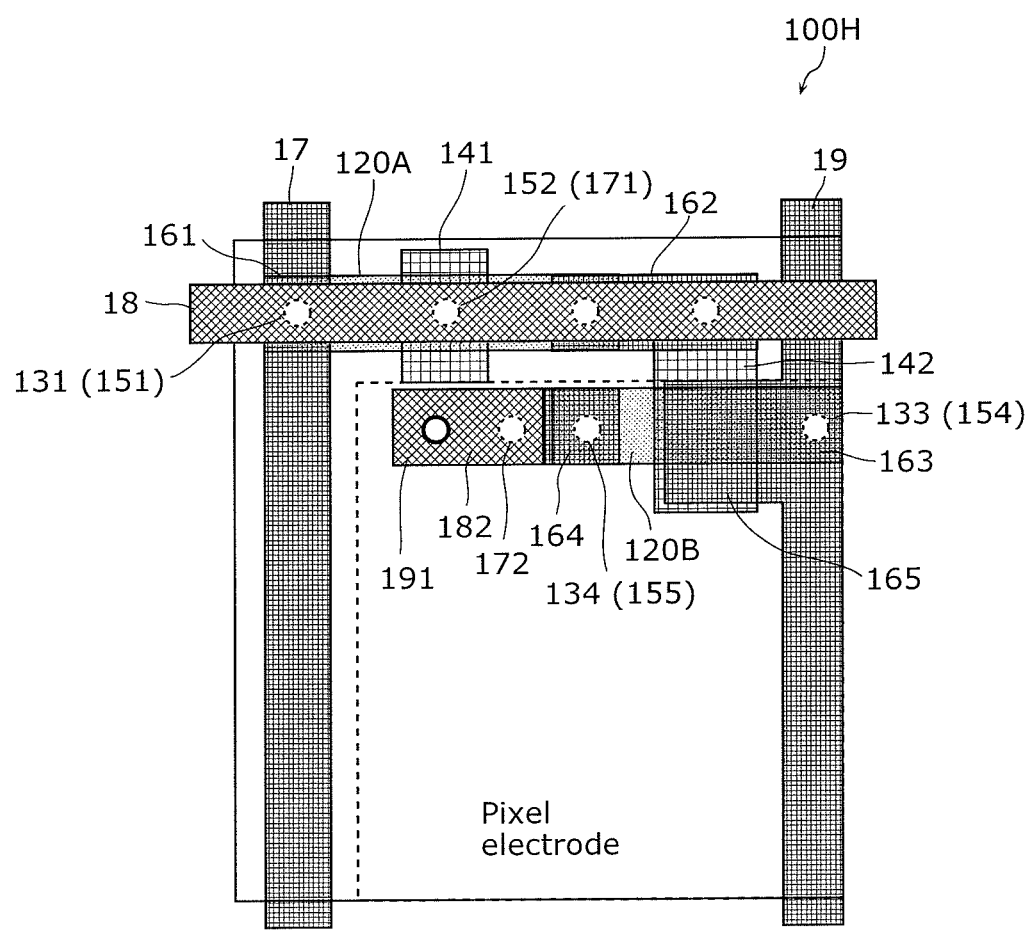
FIG. 16 is a plan view of a semiconductor device according to Modification 8 of Embodiment 1, corresponding to FIG. 15.

FIG. 16 is a plan view of a semiconductor device 100H according to Modification 8 of Embodiment 1, corresponding to FIG. 15. The semiconductor device 100H shown in FIG. 16 is different from that in FIG. 15 in that the gate line 18 is disposed at a position which overlaps with the gate electrode 141.

Embodiment 2

Figure 17:
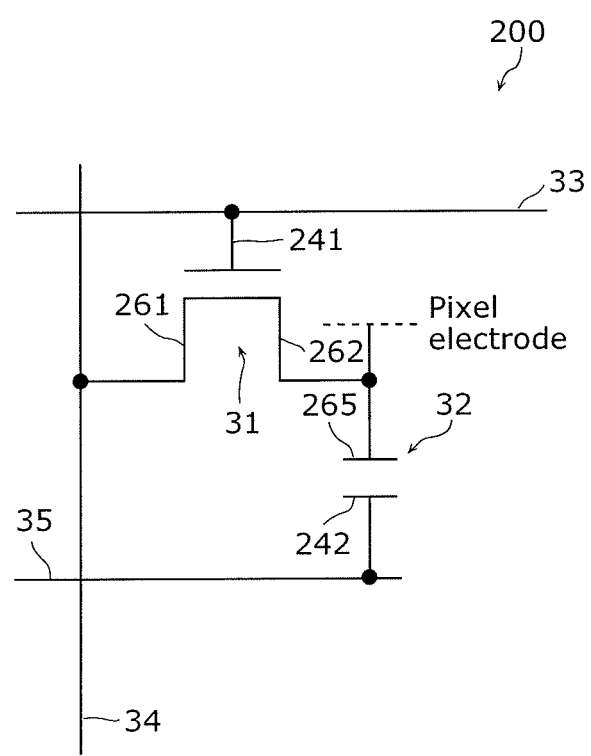
FIG. 17 is a diagram showing a circuit configuration of a pixel circuit of a liquid-crystal display apparatus.
Figure 18:
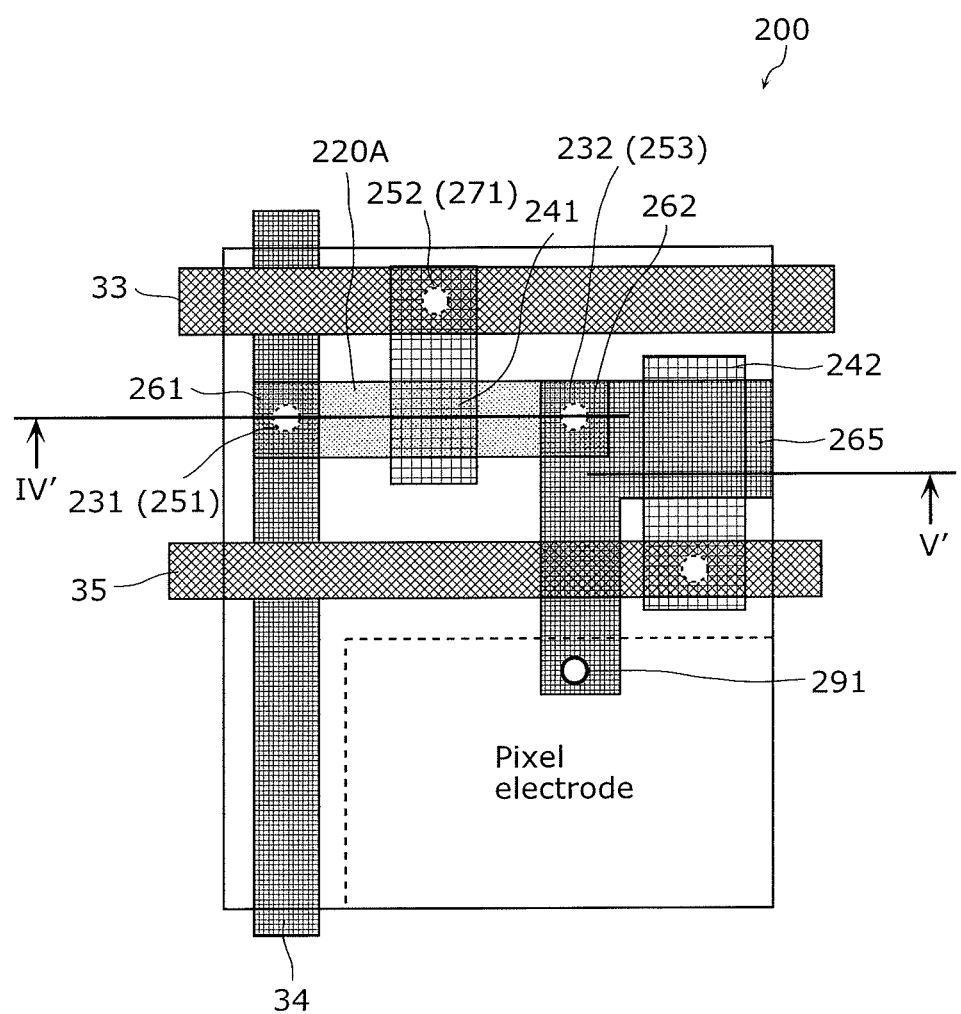
FIG. 18 is a plan view of a semiconductor device according to Embodiment 2.

Next, a semiconductor device according to Embodiment 2 of the present invention shall be described with reference to FIG. 17 and FIG. 18. FIG. 17 is a diagram showing a circuit configuration of a pixel circuit of a liquid-crystal display apparatus. FIG. 18 is a plan view of a semiconductor device 200 according to Embodiment 2.

As shown in FIG. 17, the semiconductor device 200 includes a transistor 31, a capacitor 32, a gate line 33, a source line 34, and a common line 3. In addition, a gate electrode 241 is connected to the gate line 33; a source electrode 261 is connected to the source line 34; a drain electrode 262 is connected to the pixel electrode and the electrode on one side of the capacitor 32; and a common electrode 35 is connected to the electrode on the other side of the capacitor 32.

In this configuration, when a gate signal is inputted to the gate line 33 and the transistor 31 is placed in the ON state, the signal voltage supplied via the source line 34 is stored in the capacitor 32. Furthermore, a certain potential is always applied from the common line 35 to the electrode on the other side of the capacitor 32. In addition, a holding voltage stored in the capacitor 32 is held throughout a 1-frame period. By changing the liquid-crystal orientation by applying this holding voltage to the pixel electrode, an image can be displayed.

The view of the cross-section at a line IV' in FIG. 18, as seen from the direction of the arrow, is the same as in FIG. 4. Furthermore, the view of the cross-section at a line V' in FIG. 18, as seen from the direction of the arrow, has a capacitor region (central region) in common with FIG. 5A. Specifically, the gate electrode 241 corresponds to the gate electrode 141 in FIG. 4; the source electrode 261 corresponds to the source electrode 161 in FIG. 4; the drain electrode 262 corresponds to the drain electrode 162 in FIG. 4; a first capacitor electrode 242 corresponds to the gate electrode 142 which operates as a first capacitor electrode in FIG. 5; a second capacitor electrode 265 corresponds to the second capacitor electrode 165 in FIG. 5; and contact holes 231, 232, 251, 252, 253, 271, and 291 correspond, respectively, to the contact holes 131, 132, 151, 152, 153, 171, and 191 in FIG. 4 and FIG. 5A.

(Modification 1)

Figure 19:
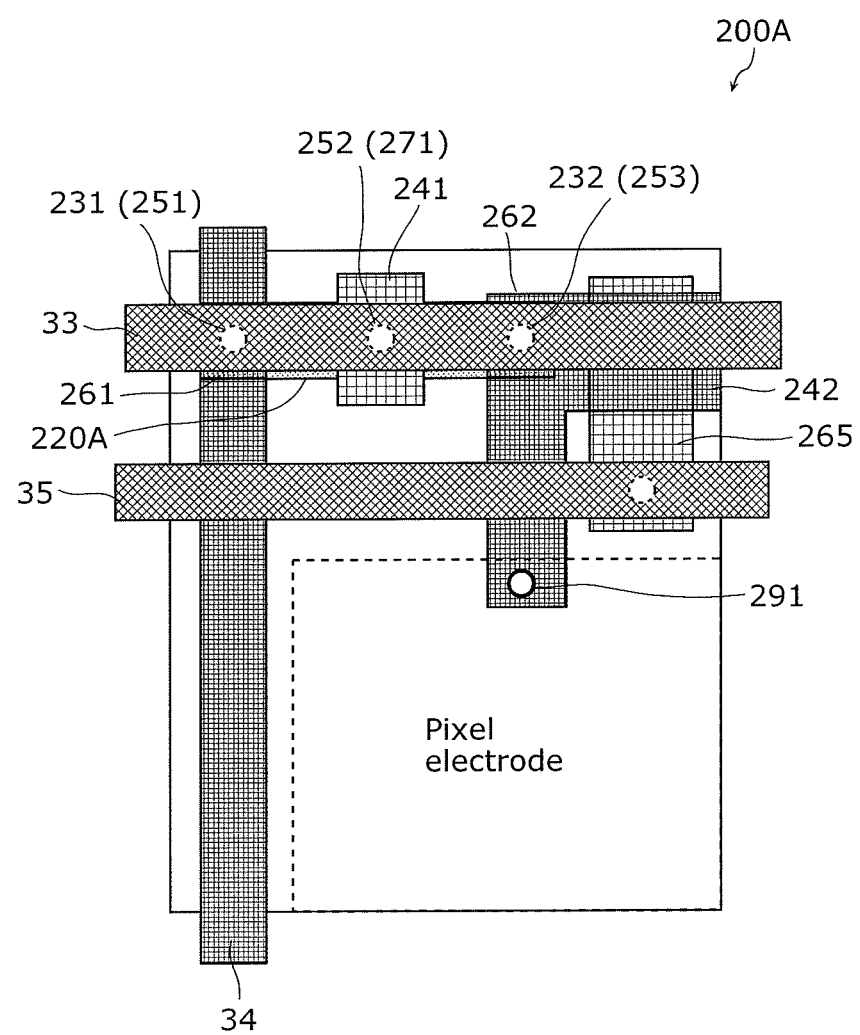
FIG. 19 is a plan view of a semiconductor device according to Modification 1 of Embodiment 2, corresponding to FIG. 18.

FIG. 19 is a plan view of a semiconductor device 200A according to Modification 1 of Embodiment 2, corresponding to FIG. 18. The semiconductor device 200A shown in FIG. 19 is different from that in FIG. 18 in that the gate line 33 is disposed at a position which overlaps with the gate electrode 241.

In this manner, the semiconductor devices according to the present invention can be applied, not only to organic EL display apparatuses which use an organic EL element, but also to other display apparatuses in which an active-matrix substrate is used, such as liquid-crystal display apparatuses. Furthermore, a display apparatus configured in the manner described above can be used as a flat-panel display, and can be applied to various electronic devices that have a display panel, such as a television set, a personal computer, a cellular phone, or the like.

Although the embodiments have been described with reference to the drawings, the present invention is not limited to the embodiments shown in the drawings. Various revisions and modifications are possible in the embodiments shown in the drawings, within the same or an equivalent scope as the present invention.

INDUSTRIAL APPLICABILITY

The present invention can be used advantageously in a thin-film semiconductor device used in a pixel circuit, or the like, in a display apparatus.

REFERENCE SIGNS LIST

10 Organic EL display apparatus
11 Active-matrix substrate
12 Pixel
13 Pixel circuit
14 Anode
15 Organic EL layer
16 Cathode
17, 34 Source line
18, 33 Gate line
19 Power source line
20, 35 Common line
21 Drive transistor
22 Switching transistor
23, 32 Capacitor
31 Transistor
100, 100A, 100B, 100C, 100D, 100E, 100E, 100F, 100G, 100H, 200, 200A Semiconductor device
110 Substrate
120A, 120B, 22A Semiconductor layer
121, 124 Channel region
122, 123, 125, 126 Contact region
130 Gate insulating film
131, 132, 133, 134, 151, 152, 153, 154, 155, 171, 172, 173, 174, 175, 176, 177, 191, 231, 232, 251, 252, 253, 271, 291 Contact hole
141, 142, 241 Gate electrode
143 Height-adjustment layer
150 Second insulating layer
161, 164, 183, 186, 261 Source electrode
162, 163, 184, 185, 262 Drain electrode
165, 265 Second capacitor electrode
166 Third connector electrode
170 Third insulating layer
181 First connector electrode
182 Second connector electrode
190 Fourth insulating layer
242 First capacitor electrode

The invention claimed is:

1. A semiconductor device comprising:
a substrate;
a semiconductor layer formed above the substrate;
a first insulating layer foamed above the semiconductor layer;
a first conducting layer formed above the first insulating layer;
a second insulating layer formed above the first conducting layer;
a second conducting layer formed above the second insulating layer;
a third insulating layer formed above the second conducting layer;
a third conducting layer formed above the third insulating layer;
a gate line; and
a source line provided crossing the gate line;
wherein the semiconductor layer includes at least a channel region and a contact region,
the first insulating layer has a first contact hole formed at a position which overlaps with the contact region, the first contact hole connecting a pattern for the second conducting layer or a pattern for the third conducting layer and the contact region of the semiconductor layer,
a pattern for the first conducting layer is disposed at a position which overlaps with at least the channel region,
the second insulating layer has:
a second contact hole formed connected to the first contact hole, the second contact hole connecting the pattern for the second conducting layer and the contact region of the semiconductor layer or the pattern for the third conducting layer and the contact region of the semiconductor layer; and
a third contact hole formed at a position which overlaps with the pattern for the first conducting layer, the third contact hole connecting the pattern for the second conducting layer and the pattern for the first conducting layer or the pattern for the third conducting layer and the pattern for the first conducting layer, the third insulating layer has a fourth contact hole, the gate line is formed in one of the second conducting layer and the third conducting layer, and connected to the pattern for the first conducting layer through at least the third contact hole, the source line is formed in the other of the second conducting layer and the third conducting layer, and connected to the contact region through any of the first to fourth contact holes, and the first conducting layer or the semiconductor layer includes a height-adjustment layer formed at a position which overlaps with the fourth contact hole.

2. The semiconductor device according to claim 1, wherein the third contact hole is formed at the position which overlaps with the channel region.

3. The semiconductor device according to claim 2, wherein the gate line is connected, through at least the third contact hole, to the pattern for the first conducting layer disposed at the position which overlaps with the channel region.

4. The semiconductor device according to claim 1, wherein the gate line is formed in the second conducting layer, and
the source line is formed in the third conducting layer.

5. The semiconductor device according to claim 1, wherein the third conducting layer has a sheet resistance smaller than a sheet resistance of the second conducting layer.

6. The semiconductor device according to claim 1, wherein the third conducting layer has a thickness greater than a thickness of the second conducting layer.

7. The semiconductor device according to claim 1, wherein the gate line is formed in the third conducting layer.

8. The semiconductor device according to claim 7, wherein the first conducting layer or the semiconductor layer includes a height-adjustment layer formed at a position which overlaps with the fifth contact hole.

9. The semiconductor device according to claim 8, wherein the second conducting layer includes a height-adjustment layer formed at a position which overlaps with the fifth contact hole.

10. The semiconductor device according to claim 1, further comprising:
a fourth insulating layer formed above the third conducting layer; and
a fourth conducting layer formed above the fourth insulating layer,
wherein the fourth insulating layer has a fifth contact hole formed at a position which overlaps with at least the pattern for the third conducting layer.

11. The semiconductor device according to claim 10, wherein the fifth contact hole is formed connected to the fourth contact hole,
the fourth contact hole is formed connected to the second contact hole, and
a pattern for the fourth conducting layer is directly connected to the contact region of the semiconductor layer through the first, second, fourth, and fifth contact holes.

12. The semiconductor device according to claim 10, wherein the fifth contact hole is formed at the position which overlaps with the pattern for the third conducting layer, and
a pattern for the fourth conducting layer is directly connected to the pattern for the third conducting layer through the fifth contact hole.

13. The semiconductor device according to claim 12, wherein the fourth contact hole is formed connected to the second contact hole, and
the pattern for the fourth conducting layer is connected to the contact region of the semiconductor layer via the pattern for the third conducting layer.

14. The semiconductor device according to claim 12, wherein the fourth contact hole is formed at a position which overlaps with the pattern for the second conducting layer, and
the pattern for the fourth conducting layer is connected to the pattern for the second conducting layer via the pattern for the third conducting layer.

15. The semiconductor device according to claim 14, wherein the second contact hole is formed connected to the first contact hole,
the pattern for the second conducting layer is formed at a position which overlaps with the second contact hole, and
the pattern for the fourth conducting layer is connected to the contact region of the semiconductor layer, via the pattern for the second conducting layer and the pattern for the third conducting layer.

16. The semiconductor device according to claim 10, wherein the fifth contact hole is formed connected to the fourth contact hole,
the fourth contact hole is formed at a position which overlaps with the pattern for the second conducting layer, and
a pattern for the fourth conducting layer is directly connected to the pattern for the second conducting layer, through the fourth and fifth contact holes.

17. The semiconductor device according to claim 15, wherein the second contact hole is formed connected to the first contact hole,
the pattern for the second conducting layer is fowled at a position which overlaps with the second contact hole, and
the pattern for the fourth conducting layer is connected to the contact region of the semiconductor layer, via the pattern for the second conducting layer.

18. The semiconductor device according to claim 1, wherein the gate line is formed in the second conducting layer,
a line to be disposed parallel to the gate line is formed in one of the first conducting layer and the second conducting layer, and
a line to be disposed parallel to the source line is formed in the third conducting layer.

19. The semiconductor device according to claim 1, further comprising
a capacitor unit including: a first capacitor electrode formed in the first conducting layer; a dielectric formed at a position in the second insulating layer which overlaps with the first capacitor electrode; and a second capacitor electrode formed at a position in the second conducting layer which overlaps with the dielectric.

20. The semiconductor device according to claim 19, wherein the second insulating layer has a per-unit area electrostatic capacitance larger than a per-unit area electrostatic capacitance of the third insulating layer.

21. The semiconductor device according to claim 1, wherein a region at which the gate line and the source line cross is insulated by the third insulating layer.

22. A semiconductor device comprising:
a substrate;
a semiconductor layer formed above the substrate;
a first insulating layer formed above the semiconductor layer;
a first conducting layer formed above the first insulating layer;
a second insulating layer formed above the first conducting layer;
a second conducting layer formed above the second insulating layer;
a third insulating layer formed above the second conducting layer;
a third conducting layer formed above the third insulating layer;
a gate line; and
a source line provided crossing the gate line;
wherein the semiconductor layer includes at least a channel region and a contact region,
the first insulating layer has a first contact hole formed at a position which overlaps with the contact region, the first contact hole connecting a pattern for the second conducting layer or a pattern for the third conducting layer and the contact region of the semiconductor layer,
a pattern for the first conducting layer is disposed at a position which overlaps with at least the channel region,
the second insulating layer has:
a second contact hole formed connected to the first contact hole, the second contact hole connecting the pattern for the second conducting layer and the contact region of the semiconductor layer or the pattern for the third conducting layer and the contact region of the semiconductor layer; and
a third contact hole formed at a position which overlaps with the pattern for the first conducting layer, the third contact hole connecting the pattern for the second conducting layer and the pattern for the first conducting layer or the pattern for the third conducting layer and the pattern for the first conducting layer,
the third insulating layer has a fourth contact hole,
the gate line is formed in the third conducting layer, and connected to the pattern for the first conducting layer through at least the third contact hole, and
the source line is formed in one of the second conducting layer and the third conducting layer, and connected to the contact region through any of the first to fourth contact holes,
the semiconductor device further comprising:
a capacitor unit including: a first capacitor electrode formed in the first conducting layer; a dielectric formed at a position in the second insulating layer which overlaps with the first capacitor electrode; and a second capacitor electrode formed at a position in the second conducting layer which overlaps with the dielectric,
wherein a region at which the gate line and the source line cross is insulated by the third insulating layer, and
the second insulating layer has a per-unit area electrostatic capacitance larger than a per-unit area electrostatic capacitance of the third insulating layer.

23. A display apparatus including pixels arranged in a matrix, the display apparatus comprising:
gate lines disposed parallel to each other;
source lines disposed parallel to each other and crossing the gate lines; and
a plurality of the semiconductor devices according to claim 1, which drive the pixels each of which is formed at a different one of crosspoints between the gate lines and the source lines.

* * * * *